United States Patent
Duncan et al.

(10) Patent No.: US 12,477,680 B2
(45) Date of Patent: Nov. 18, 2025

(54) OVER-RACK COMPONENT TRACK SYSTEM FOR MODULAR DATA CENTERS

(71) Applicant: Dell Products L.P., Round Rock, TX (US)

(72) Inventors: Tyler Baxter Duncan, Austin, TX (US); Anthony Middleton, Cedar Park, TX (US)

(*) Notice: Subject to any disclaimer, the term of this patent is extended or adjusted under 35 U.S.C. 154(b) by 457 days.

(21) Appl. No.: 17/970,295

(22) Filed: Oct. 20, 2022

(65) Prior Publication Data
US 2024/0138088 A1 Apr. 25, 2024
US 2024/0237255 A9 Jul. 11, 2024

(51) Int. Cl.
*H05K 7/14* (2006.01)
*H05K 5/02* (2006.01)
*H05K 7/20* (2006.01)

(52) U.S. Cl.
CPC ......... *H05K 7/1487* (2013.01); *H05K 5/0256* (2013.01); *H05K 7/1489* (2013.01); *H05K 7/20145* (2013.01)

(58) Field of Classification Search
CPC ... H05K 7/1488; H05K 7/1489; H05K 7/1498
See application file for complete search history.

(56) References Cited

U.S. PATENT DOCUMENTS

| | | | | |
|---|---|---|---|---|
| 2,857,558 A * | 10/1958 | Fiske | ...................... | B65D 85/38 324/756.01 |
| 3,295,905 A * | 1/1967 | Sisk | ...................... | H01R 35/02 312/273 |
| 5,548,489 A * | 8/1996 | Reed | ...................... | H04Q 1/025 361/752 |
| 6,459,571 B1 * | 10/2002 | Carteau | ...................... | G06F 1/184 361/679.33 |
| 6,621,692 B1 * | 9/2003 | Johnson | ............... | H05K 7/1421 361/679.55 |
| 6,891,727 B2 * | 5/2005 | Dittus | .................. | H05K 7/1489 312/334.5 |
| 7,031,588 B2 * | 4/2006 | Cowley | ................ | G02B 6/4452 312/323 |
| 7,346,913 B2 * | 3/2008 | Ishimine | .............. | G11B 33/128 |
| 7,423,870 B2 * | 9/2008 | Carlisi | ................. | H05K 7/1489 361/679.41 |
| 7,558,973 B2 * | 7/2009 | Huang | .................... | G06F 1/184 713/300 |
| 7,810,653 B2 * | 10/2010 | Schmidtke | ........... | H05K 7/1421 211/26 |
| 7,821,790 B2 * | 10/2010 | Sharma | ................ | H05K 7/1424 361/725 |

(Continued)

*Primary Examiner* — Adrian S Wilson
(74) *Attorney, Agent, or Firm* — Chamberlain, Hrdlicka, White, Williams & Aughtry; Aly Z. Dossa

(57) ABSTRACT

A modular data center includes: a modular information technology component (MITC), in which the MITC includes a modular over-rack component (MORC) and a track system, in which the MORC is affixed perpendicularly to the track system, in which the track system permits the MORC to be repositioned along the track system; and a modular environmental control component (MECC), in which the MECC includes a plurality of environmental control components (ECCs) and built-in airflow connection components, in which the built-in airflow connection components remove and supply air to the MITC.

7 Claims, 11 Drawing Sheets

(56) References Cited

U.S. PATENT DOCUMENTS

| | | | | |
|---|---|---|---|---|
| 7,940,521 B2* | 5/2011 | Carlisi | ............... | G06F 1/183 |
| | | | | 361/679.41 |
| 8,035,976 B2* | 10/2011 | Snider | ............... | H05K 5/0226 |
| | | | | 361/752 |
| 8,061,534 B2* | 11/2011 | Laursen | ............... | H04Q 1/09 |
| | | | | 211/26 |
| 8,259,450 B2* | 9/2012 | Dunwoody | ........ | H05K 7/1497 |
| | | | | 307/14 |
| 8,327,589 B2* | 12/2012 | Sutton | ............... | A47B 96/20 |
| | | | | 52/27 |
| 8,477,491 B1* | 7/2013 | Ross | ............... | H05K 7/20736 |
| | | | | 361/679.48 |
| 8,582,299 B1* | 11/2013 | Phillips | ............ | H05K 7/1492 |
| | | | | 361/727 |
| 8,976,515 B2* | 3/2015 | Schmitt | ............ | G06F 1/1601 |
| | | | | 312/352 |
| 9,131,618 B2 | 9/2015 | Peterson | | |
| 9,198,310 B2* | 11/2015 | Eichelberg | ........ | H05K 7/20745 |
| 9,263,869 B2* | 2/2016 | Prince | ............... | H02J 7/0044 |
| 9,345,165 B1* | 5/2016 | Phillips | ............ | G06F 1/181 |
| 9,398,809 B2* | 7/2016 | Ross | ............... | G06F 1/16 |
| 9,572,276 B2* | 2/2017 | Haroun | ............ | H05K 7/1488 |
| 10,042,396 B1* | 8/2018 | Gupta | ............... | G05B 19/0421 |
| 10,136,556 B2* | 11/2018 | Bilski | ............... | H05K 7/20672 |
| 10,244,652 B1* | 3/2019 | Czamara | ............ | H05K 7/1489 |
| 10,869,405 B1 | 12/2020 | Bailey | | |
| 11,249,816 B2* | 2/2022 | Aoki | ............... | G11C 29/36 |
| 11,382,232 B1* | 7/2022 | Madhavkant | ........ | H05K 7/1487 |
| 11,388,833 B2* | 7/2022 | Gao | ............... | H05K 7/1401 |
| 11,758,695 B2* | 9/2023 | Dumas | ............... | H05K 7/20745 |
| | | | | 361/679.46 |
| 11,805,618 B2* | 10/2023 | Ruiz Holguin | ........ | H05K 5/02 |
| 11,956,918 B1* | 4/2024 | Duncan | ............ | H05K 7/18 |
| 12,238,887 B2* | 2/2025 | Duncan | ............ | H05K 7/20 |
| 12,248,301 B2* | 3/2025 | Duncan | ............ | G05B 19/4155 |
| 2001/0037985 A1* | 11/2001 | Varghese | ............ | A47B 88/43 |
| | | | | 211/151 |
| 2004/0037046 A1* | 2/2004 | Dittus | ............ | G06F 1/183 |
| | | | | 361/727 |
| 2004/0120106 A1* | 6/2004 | Searby | ............ | G06F 1/181 |
| | | | | 361/679.58 |
| 2004/0120123 A1* | 6/2004 | Mayer | ............... | H05K 7/1489 |
| | | | | 361/725 |
| 2004/0129657 A1* | 7/2004 | Dean | ............... | H05K 7/1489 |
| | | | | 211/26 |
| 2004/0233643 A1* | 11/2004 | Bolich | ............... | H05K 7/1489 |
| | | | | 361/727 |
| 2005/0050185 A1* | 3/2005 | King | ............... | H04L 63/0428 |
| | | | | 709/228 |
| 2005/0162838 A1* | 7/2005 | Mayer | ............... | H05K 7/1489 |
| | | | | 361/725 |
| 2005/0237721 A1* | 10/2005 | Cowley | ............... | G02B 6/4452 |
| | | | | 361/727 |
| 2007/0097619 A1* | 5/2007 | Quijano | ............... | F16M 11/041 |
| | | | | 361/679.4 |
| 2007/0115627 A1* | 5/2007 | Carlisi | ............... | G06F 1/183 |
| | | | | 361/679.01 |
| 2007/0217172 A1* | 9/2007 | Bisbikis | ............... | H05K 9/0016 |
| | | | | 361/753 |
| 2008/0049385 A1* | 2/2008 | Cox | ............... | H05K 7/1411 |
| | | | | 361/725 |
| 2008/0062655 A1* | 3/2008 | Laursen | ............... | H04Q 1/09 |
| | | | | 361/733 |
| 2008/0144293 A1* | 6/2008 | Aksamit | ............... | H05K 7/1489 |
| | | | | 29/428 |
| 2008/0266813 A1* | 10/2008 | Carlisi | ............... | G06F 1/183 |
| | | | | 361/727 |
| 2009/0034181 A1* | 2/2009 | Gizycki | ............... | H01R 13/652 |
| | | | | 361/822 |
| 2009/0263992 A1* | 10/2009 | Dittus | ............... | H05K 7/1492 |
| | | | | 439/110 |
| 2010/0172083 A1* | 7/2010 | Randall | ............... | G11B 33/126 |
| | | | | 361/679.01 |
| 2010/0172087 A1* | 7/2010 | Jeffery | ............... | H02G 11/00 |
| | | | | 361/679.48 |
| 2010/0265651 A1* | 10/2010 | Huang | ............... | G06F 1/183 |
| | | | | 361/679.02 |
| 2010/0314339 A1* | 12/2010 | Laursen | ............... | H04Q 1/09 |
| | | | | 211/26 |
| 2011/0189936 A1* | 8/2011 | Haspers | ............... | H05K 7/1497 |
| | | | | 211/26 |
| 2011/0291852 A1* | 12/2011 | Forristal | ............... | H05K 7/186 |
| | | | | 211/26 |
| 2012/0200992 A1* | 8/2012 | Schmitt | ............... | H05K 7/1497 |
| | | | | 361/679.02 |
| 2014/0120824 A1* | 5/2014 | Lin | ............... | H05K 7/20736 |
| | | | | 454/184 |
| 2015/0047268 A1* | 2/2015 | Pensi | ............... | A47B 96/06 |
| | | | | 52/36.5 |
| 2015/0077924 A1* | 3/2015 | Rauline | ............... | G11B 33/128 |
| | | | | 361/679.39 |
| 2015/0208554 A1* | 7/2015 | Leigh | ............... | H05K 7/20754 |
| | | | | 165/80.3 |
| 2015/0327381 A1* | 11/2015 | Alshinnawi | ........ | H05K 5/0217 |
| | | | | 361/679.02 |
| 2016/0194863 A1* | 7/2016 | Schmitt | ............... | E04B 1/34321 |
| | | | | 52/745.02 |
| 2016/0194893 A1* | 7/2016 | Schmitt | ............... | G06F 1/189 |
| | | | | 52/173.1 |
| 2016/0262283 A1* | 9/2016 | Phillips | ............... | G06F 1/181 |
| 2016/0291645 A1* | 10/2016 | Alvarado | ............... | G06F 1/183 |
| 2017/0303439 A1* | 10/2017 | Cader | ............... | H05K 7/20836 |
| 2019/0069433 A1* | 2/2019 | Balle | ............... | H04L 47/83 |
| 2019/0387291 A1* | 12/2019 | Adiletta | ............... | G11C 14/0009 |
| 2024/0232035 A9* | 7/2024 | Toulouse | ............... | G01K 13/024 |
| 2024/0237252 A9* | 7/2024 | Duncan | ............... | H05K 7/202 |
| 2024/0237262 A9* | 7/2024 | Duncan | ............... | H05K 7/1431 |
| 2024/0237301 A9* | 7/2024 | Duncan | ............... | H05K 7/2079 |

* cited by examiner

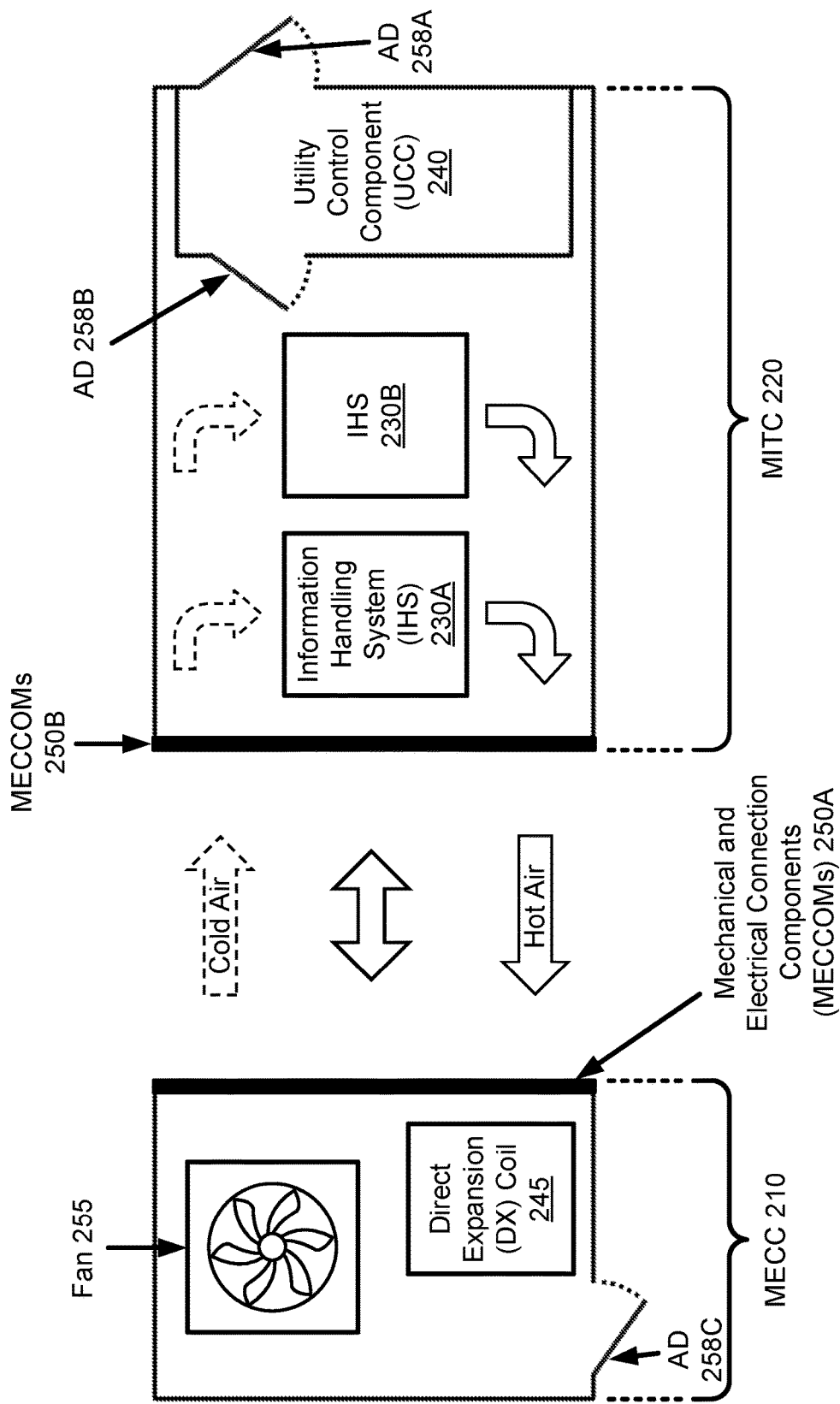
FIG. 2.1

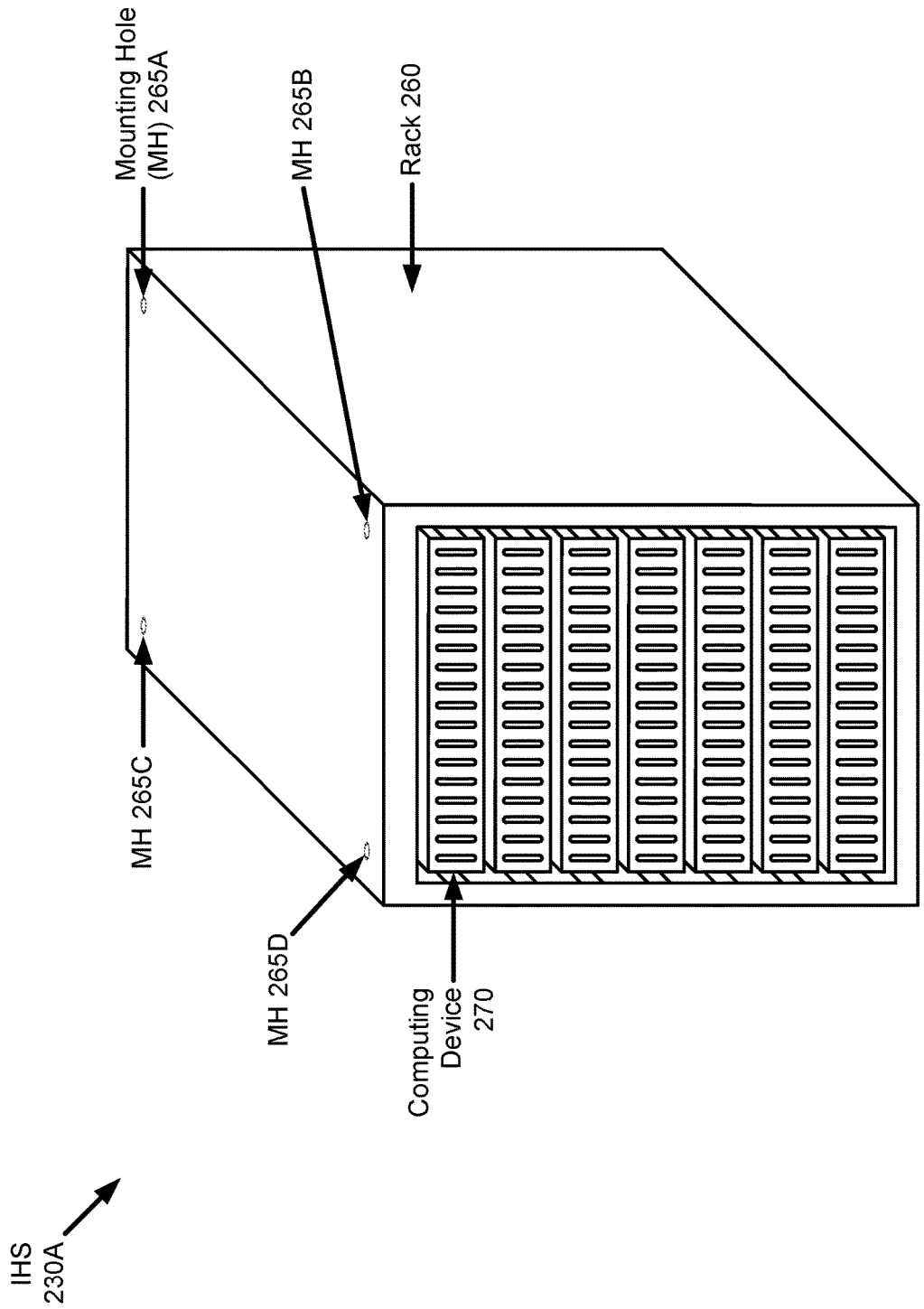
FIG. 2.2

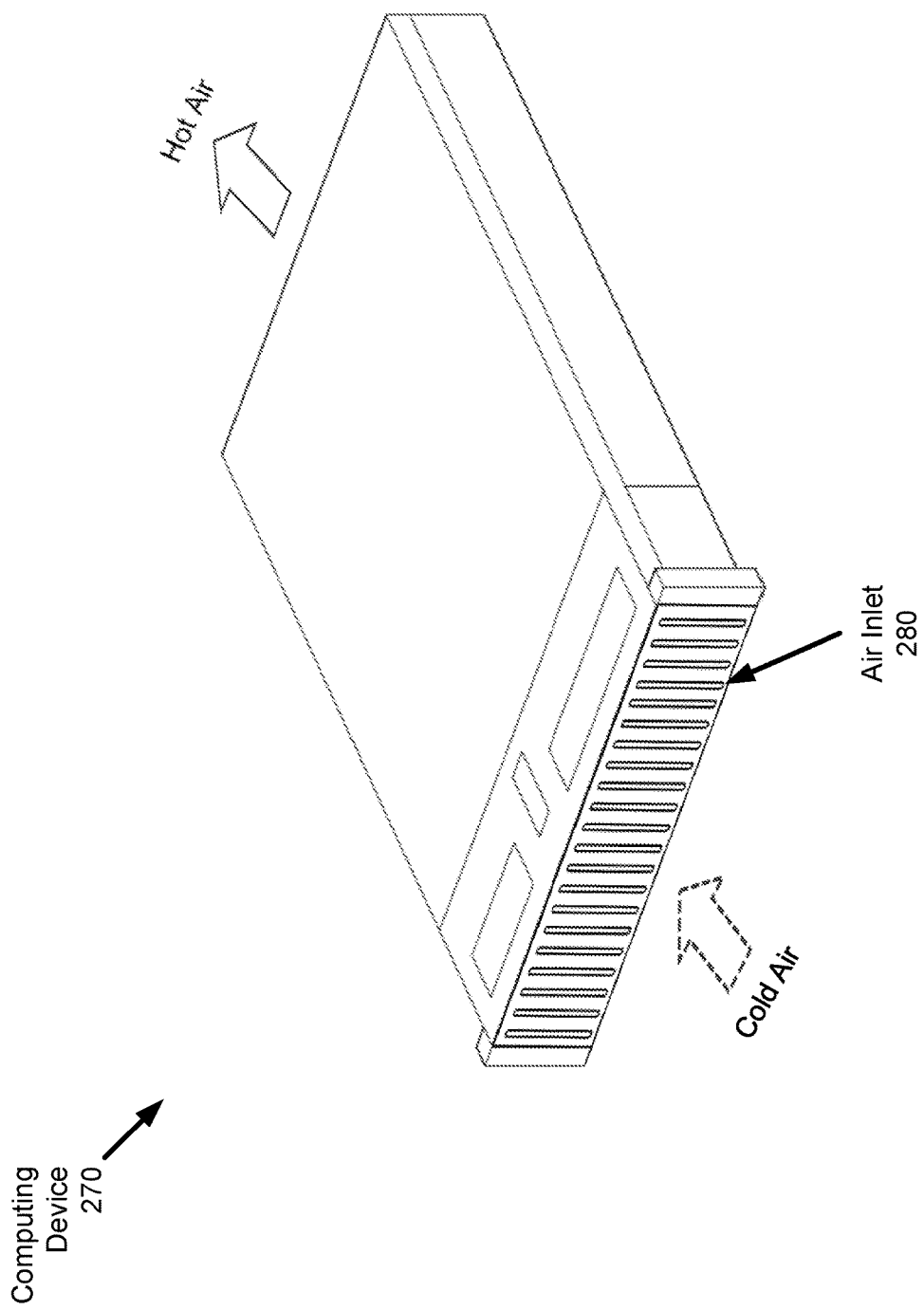
FIG. 2.3

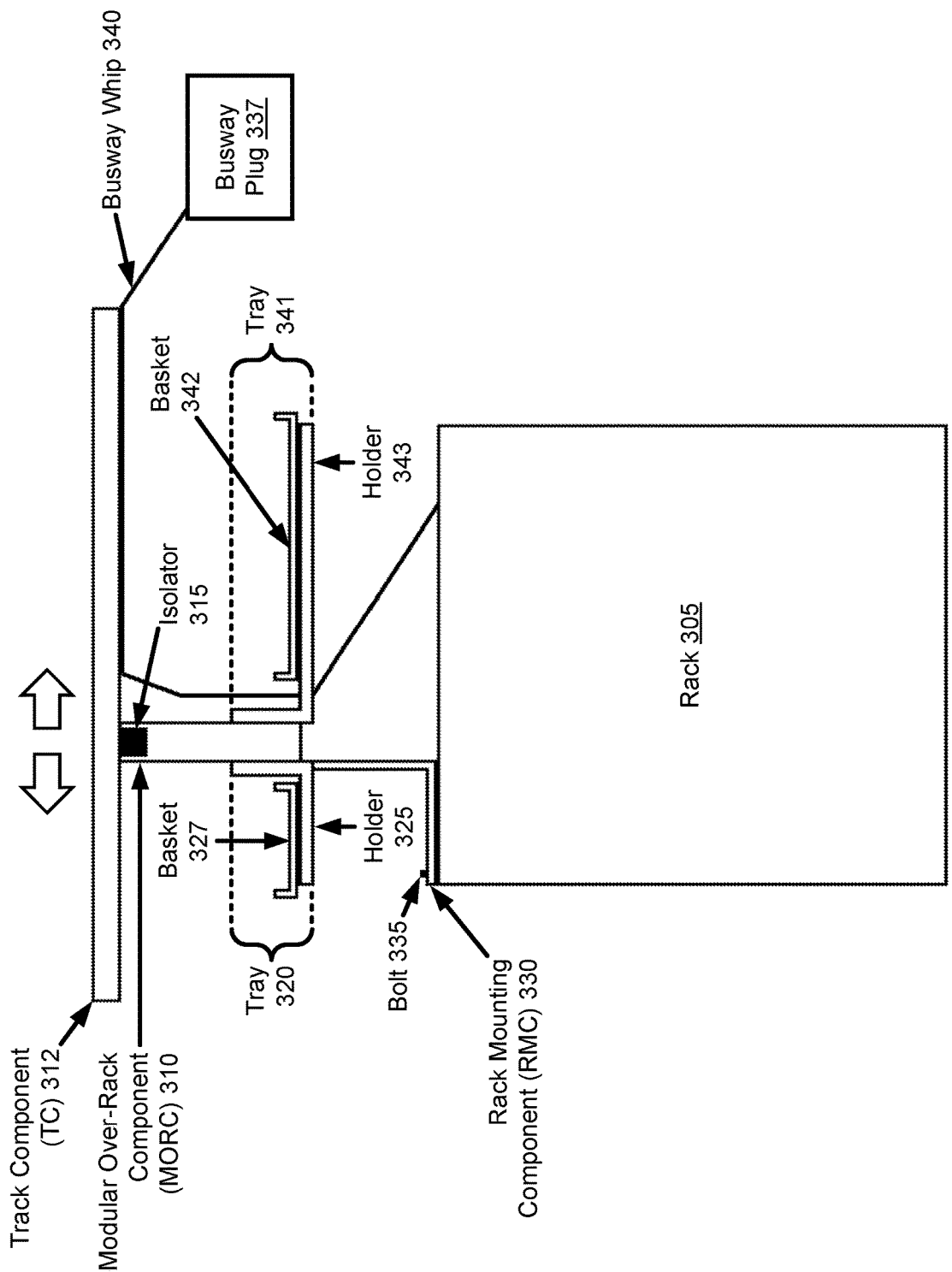
FIG. 3.1

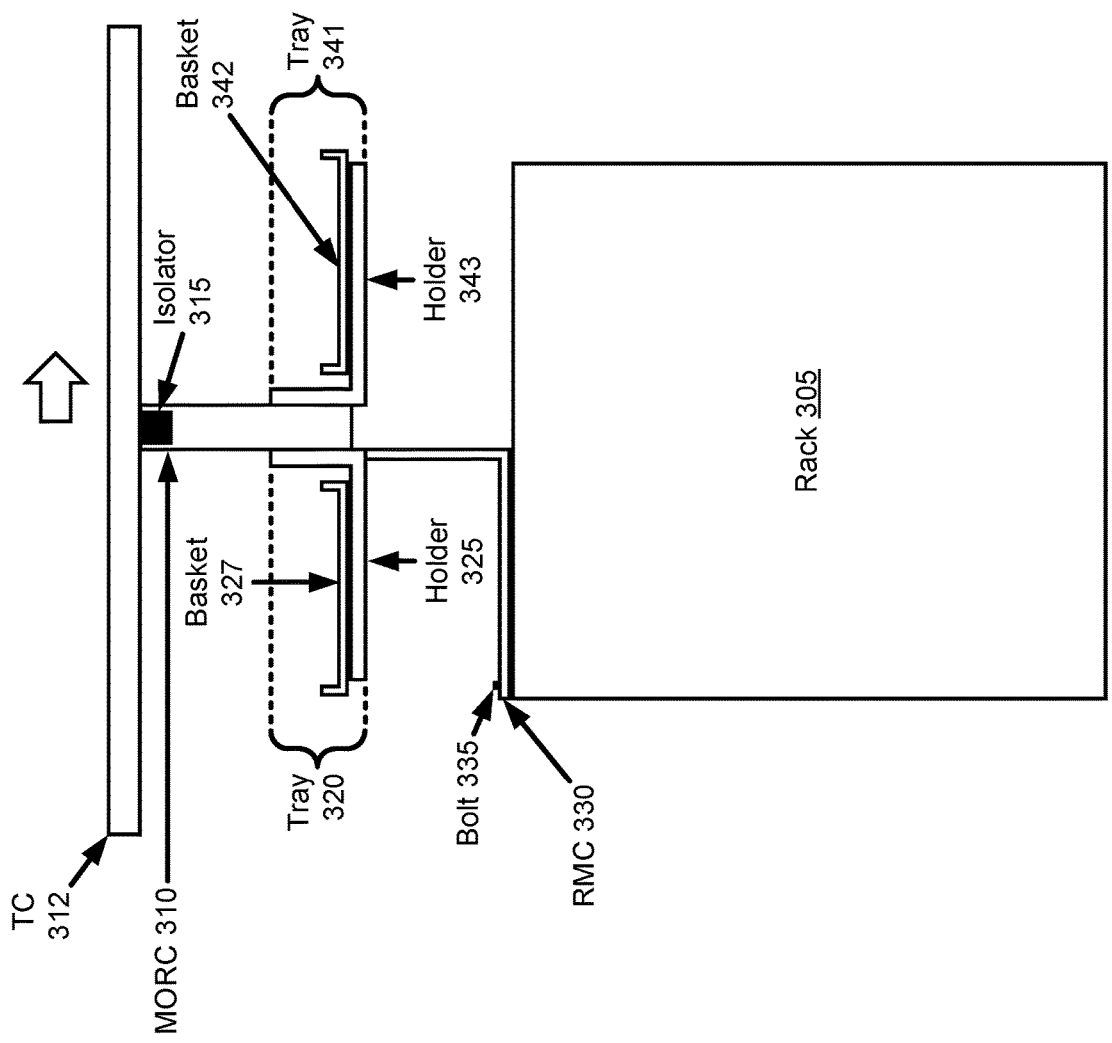
FIG. 3.2

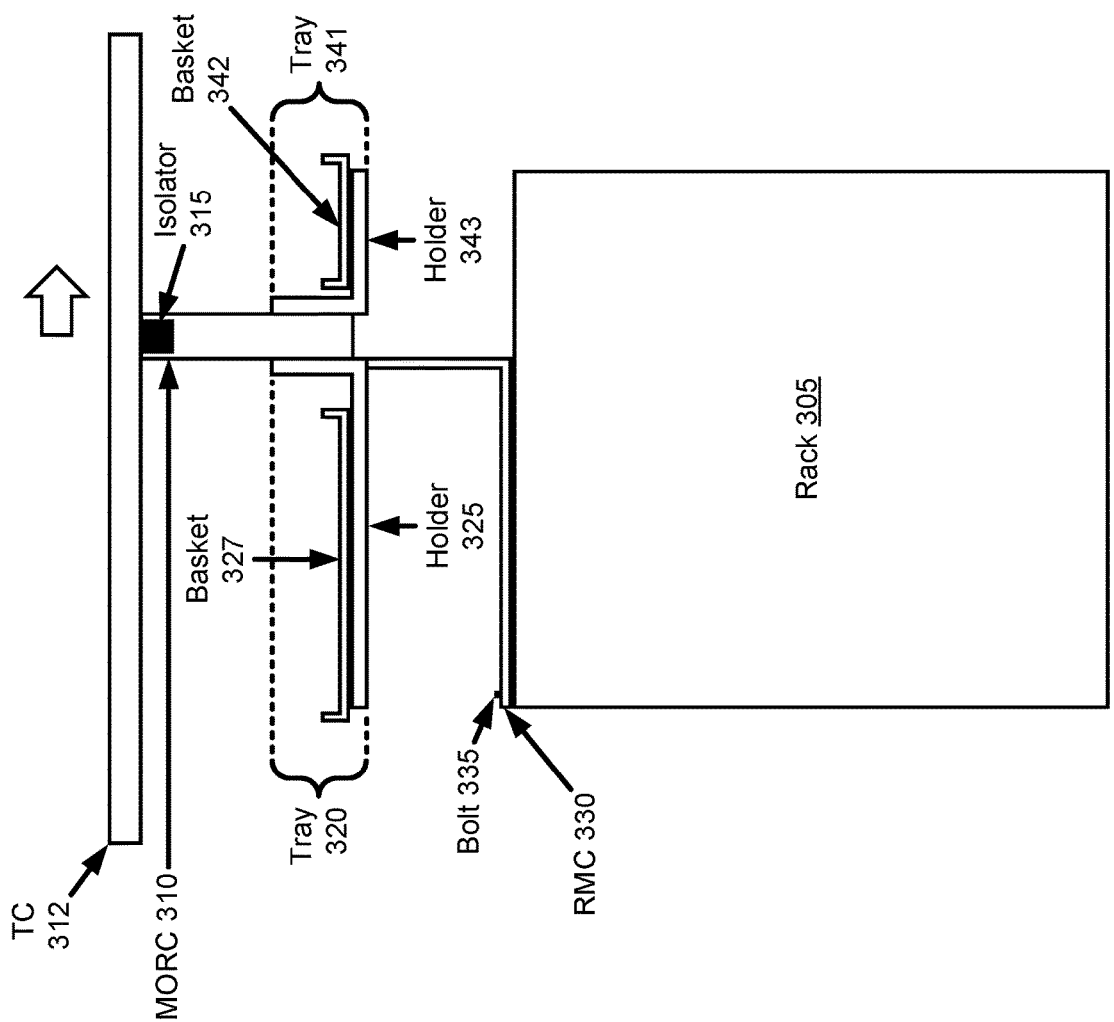
FIG. 3.3

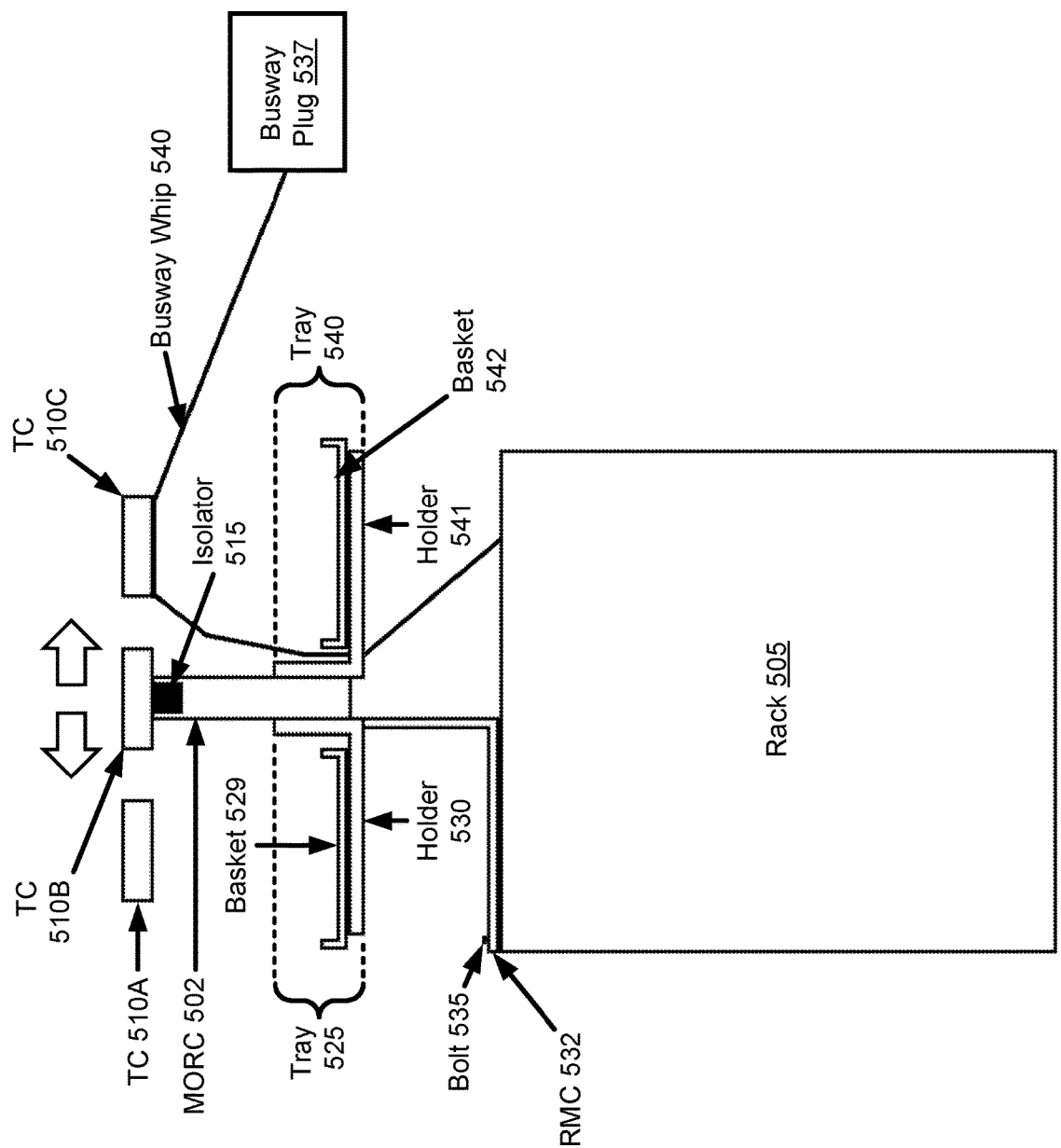
FIG. 5.1

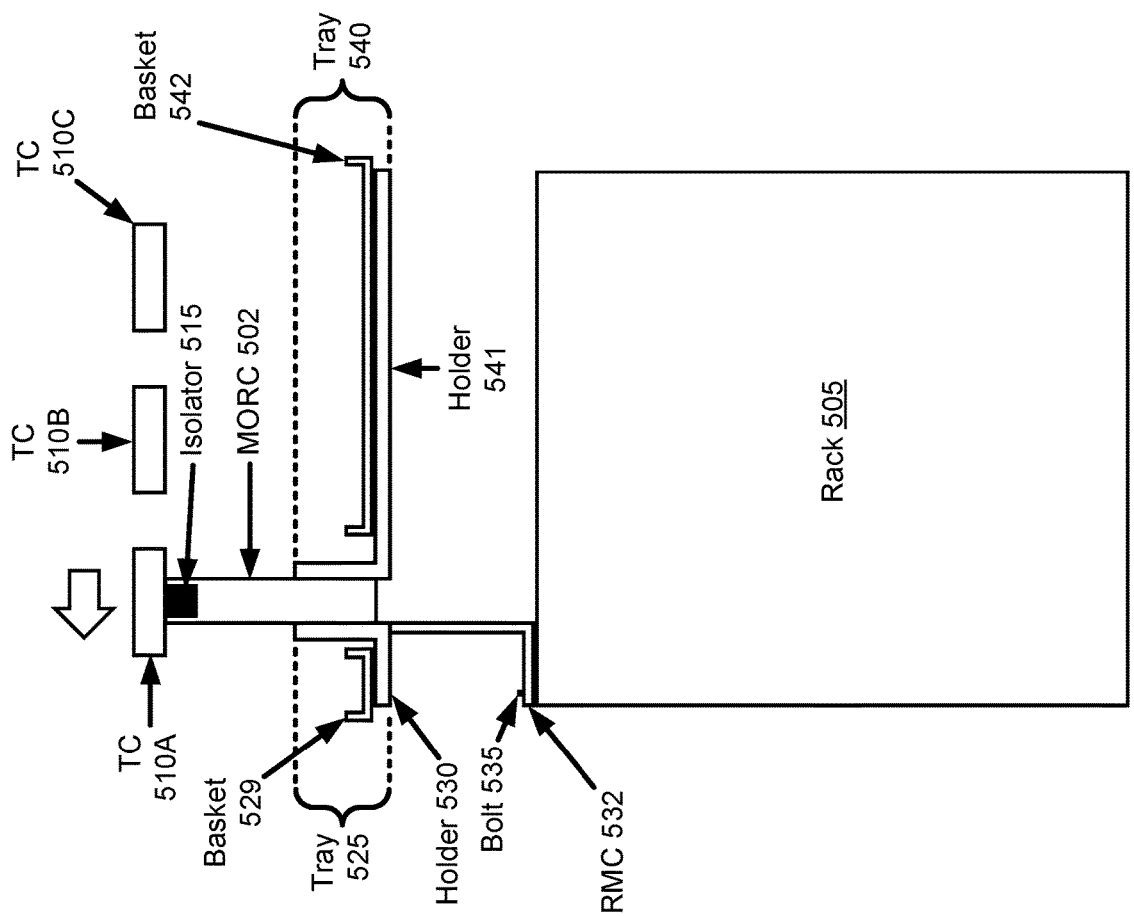
FIG. 5.2

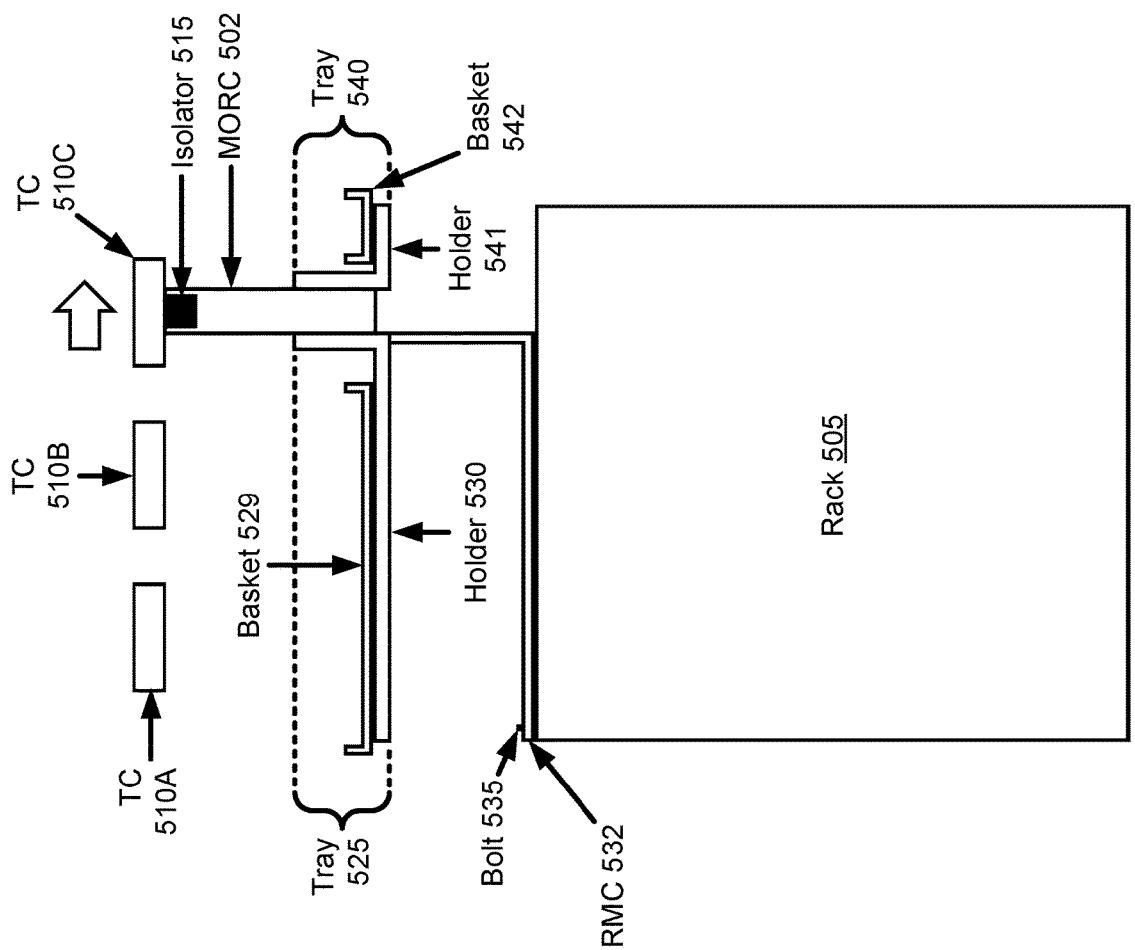
FIG. 5.3

OVER-RACK COMPONENT TRACK SYSTEM FOR MODULAR DATA CENTERS

BACKGROUND

The heterogeneous data center environments witnessed today often require a combination of various cooling, power, and information technology (IT) components. The cooling, power, and IT components are available either commercially with minimum configuration options (e.g., one-size-fits-all) or through a full custom solution for a specific customer demand. This either impacts scalability of the heterogeneous data center environments, or requires resource-intensive engineering for deployment of the cooling, power, and IT components.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 2.1 shows a top view of the system of FIG. 1 in accordance with one or more embodiments of the invention.

FIG. 2.2 shows a diagram of an information handling system (IHS) in accordance with one or more embodiments of the invention.

FIG. 2.3 shows a diagram of a computing device in accordance with one or more embodiments of the invention.

FIGS. 3.1-3.3 show side views of a portion of a modular information technology component (MITC) in accordance with one or more embodiments of the invention.

FIGS. 5.1-5.3 show side views of a portion of an MITC in accordance with one or more embodiments of the invention.

DETAILED DESCRIPTION

Figure 1:
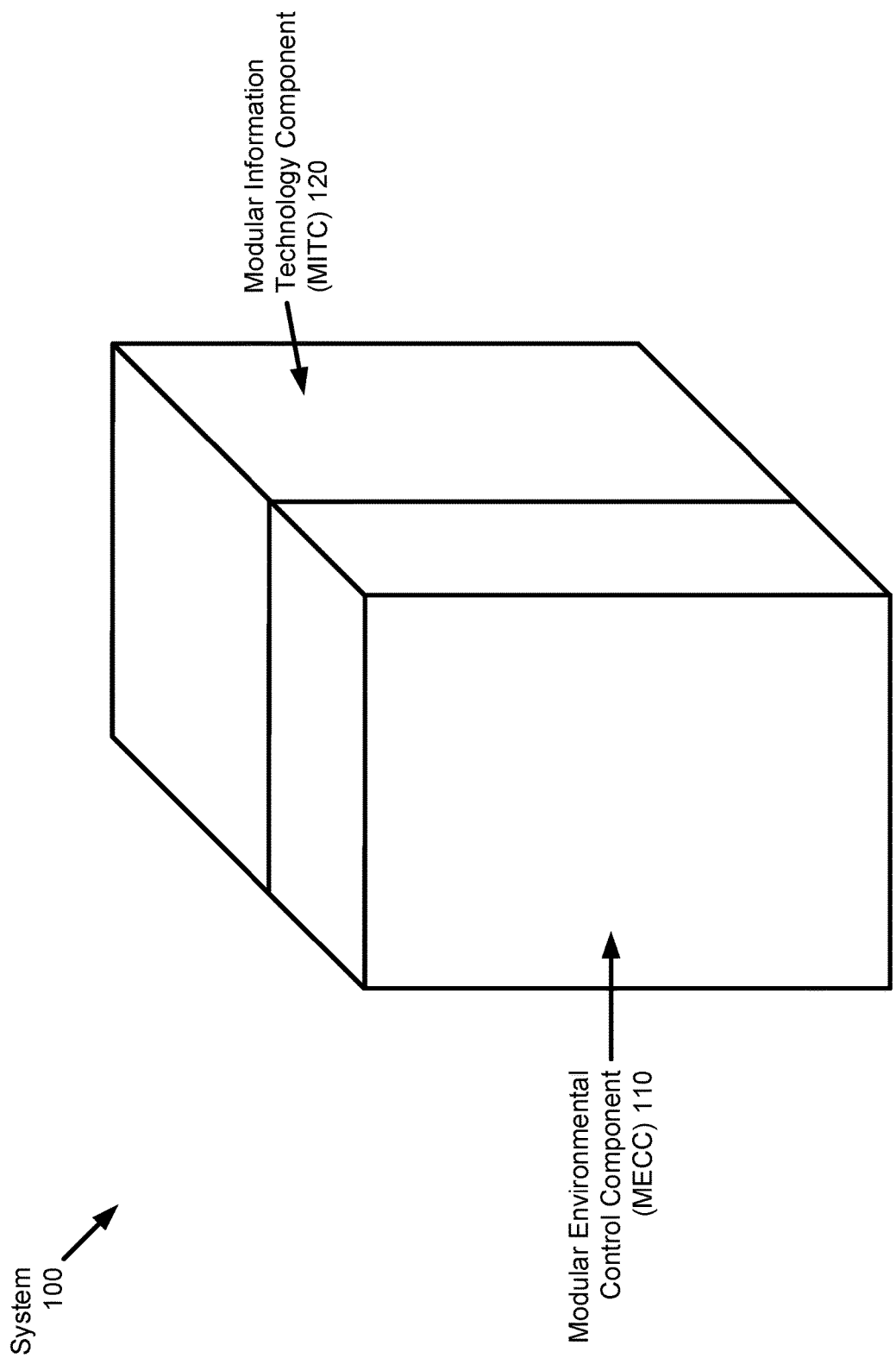
FIG. 1 shows a diagram of a system in accordance with one or more embodiments of the invention.

Specific embodiments of the invention will now be described in detail with reference to the accompanying figures. In the following detailed description of the embodiments of the invention, numerous specific details are set forth in order to provide a more thorough understanding of one or more embodiments of the invention. However, it will be apparent to one of ordinary skill in the art that one or more embodiments of the invention may be practiced without these specific details. In other instances, well-known features have not been described in detail to avoid unnecessarily complicating the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items, and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure, and the number of elements of the second data structure, may be the same or different.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct connection (e.g., wired directly between two devices or components) or indirect connection (e.g., wired and/or wireless connections between any number of devices or components connecting the operatively connected devices). Thus, any path through which information may travel may be considered an operative connection.

In general, before shipping a modular data center (MDC) to a customer site, components (e.g., first type of IHSs, an over-rack component, etc.) of the MDC are pre-integrated into the MDC for safety purposes. Once the components are pre-integrated into the MDC, the MDC may then be shipped to the customer site. Typically, in order to satisfy requirements (e.g., having additional air containment components within the MDC, having a cable management tower within the MDC, etc.) of a customer, the first type of IHSs and the over-rack component are positioned into particular locations within the MDC. When the customer changes, for example, the first type of IHSs with second type of IHSs, the position of the over-rack component may not support the second type of IHSs. To accommodate the aforementioned alteration in the MDC, the over-rack component may need to be redesigned; however, redesigning the over-rack component requires resource (e.g., engineering, manufacturing, procurement, etc.) intensive efforts.

To address one or more of the aforementioned issues, embodiments of the invention provide an over-rack component track system that can accommodate the aforementioned alteration without redesigning the over-rack component. More specifically, embodiments of the invention describe how to accommodate the aforementioned alteration by repositioning the over-rack component along the track system. This advantageously provides a repositionable modular over-rack component (MORC) that can accommodate the aforementioned alteration without requiring the resource-intensive efforts and without redesigning the MORC.

The following describes various embodiments of the invention.

As used herein, an "MDC" includes any facility or a portion of a facility in which computing operations are carried out. An MDC may include IHSs and IHS components coupled together as functional IHSs, in which the IHSs and the functional IHSs are dedicated to serve specific functions or to serve multiple functions. Examples of computing operations may include (but not limited to): information processing, communications, testing, simulations, power distribution and control, operational control, etc.

Turning now to FIG. 1, FIG. 1 shows a diagram of a system (100) in accordance with one or more embodiments of the invention. The system (100) includes an MITC (120) and a modular environmental control component (MECC) (110). The system (100) may include additional, fewer, and/or different components (e.g., modular building blocks) without departing from the scope of the invention. Each component illustrated in FIG. 1 is described below in reference to FIG. 2.1.

Turning now to FIG. 2.1, FIG. 2.1 shows a top view of the system of FIG. 1 in accordance with one or more embodiments of the invention. In an embodiment of the invention shown in FIG. 2.1, the MITC (220) may be a mechanical structure that enables one or more IHSs (230A, 230B), a utility control component (UCC) (240), an over-rack component track system (see FIGS. 3.1 and 5.1), and a MORC (e.g., 310, FIG. 3.1) to be disposed within the MITC (220).

In one or more embodiments, while disposing, the IHSs (230A, 230B) may be affixed to a floor (not shown) within the MITC (220) via standard mechanical mechanisms (e.g., bolts, screws, nuts, studs, etc.). In one or more embodiments, the floor is affixed to a bottom side of the MITC (220). Other mechanical or non-mechanical (e.g., glue, an adhesive tape, etc.) mechanisms for affixing the IHSs (230A, 230B) to the floor may be used without departing from the scope of the invention.

In one or more embodiments, a white space within the MITC (220), where the IHSs (230A, 230B) are located, may have a functionality to host different types of standard racks (e.g., 4×750 millimeter (mm) wide racks, 5×600 mm wide racks, 5×48 rack unit (RU) racks, etc.). As a unit of measurement, the RU is equal to 1.75 inches and the RU defines an increment within a standard rack. The white space may also have a functionality to host custom designed racks. Both standard (e.g., off-the-shelf) racks and custom designed racks may be pre-integrated into the floor before transportation to the customer site (e.g., a customer location, a customer facility, etc.).

In one or more embodiments, apart from hosting the IHSs (230A, 230B), the white space may also host other components, for example (but not limited to): immersion tanks, uninterruptible power supplies (UPSs), battery racks, cable management towers, cooling distribution units (CDUs), etc.

The aforementioned example is not intended to limit the scope of the invention.

In one or more embodiments, while disposing, the over-rack component track system may be affixed to a ceiling (e.g., a top side) of the MITC (220) via the standard mechanical mechanisms. Further, while disposing, the MORC (e.g., 310, FIG. 3.1) may be affixed to the over-rack component track system (also referred to herein simply as "track system") via the standard mechanical mechanisms. Other mechanical or non-mechanical mechanisms for affixing the track system and the MORC (e.g., 310, FIG. 3.1) may be used without departing from the scope of the invention. Additional details of the track system and the MORC are described below in reference to FIGS. 3.1-5.3.

In one or more embodiments, the MITC (220) may be implemented as other types of structures adapted to host, position, orient, and/or otherwise physically, mechanically, electrically, and/or thermally manage the IHSs (230A, 230B), the UCC (240), the track system, and the MORC (e.g., 310, FIG. 3.1). In this manner, the MITC (220) may enable the IHSs (230A, 230B), the UCC (240), the track system, and the MORC (e.g., 310, FIG. 3.1) to be densely packed without negatively impacting the operation of the IHSs (230A, 230B), the UCC (240), the track system, and the MORC (e.g., 310, FIG. 3.1).

In one or more embodiments, an IHS (e.g., 230A) may include a rack and any number of computing devices. Additional details of the IHS are described below in reference to FIGS. 2.2 and 2.3.

In one or more embodiments, the UCC (240) is integrated within the MITC (220) to support different types of IHSs, in which the UCC-integrated MITC is manufactured as a monolithic system. This implies that the UCC (240) is not a separate, standalone component.

In one or more embodiments, the UCC (240) may include one or more physical devices (e.g., panels, units, switchboards, etc.) that may provide functionality, for example (but not limited to): to detect a temperature within a system, to detect fire/smoke within a system, to suppress fire/smoke within a system, to provide an access control to a component, to manage a power distribution to a component, to manage a temperature within a system, etc.

The aforementioned example is not intended to limit the scope of the invention.

In one or more embodiments, the UCC (240) may include an environmental control component (ECC) control panel (not shown) that is configured to manage a temperature within the system (e.g., 100, FIG. 1) and to provide heating and/or cooling control services. The heating and/or cooling control services may include, for example (but not limited to): (i) obtaining information relating to a temperature of one or more components within the system (e.g., 100, FIG. 1), where the information may be obtained through a number of temperature sensors (discussed below) within the system (e.g., 100, FIG. 1), (ii) determining whether the temperature within the system (e.g., 100, FIG. 1) is below or above an appropriate operating temperature level (e.g., above 0° C.), (iii) initiating, based on the determination in (ii), a heating process (e.g., activating a heater component within a MECC (210)) to bring the IHSs (230A, 230B) into their designed operating temperature levels, (iv) initiating, based on the determination in (ii), a cooling process (e.g., activating a fluid mixture unit within the MECC (210)) to bring the IHSs (230A, 230B) into their designed operating temperature levels, (v) preventing damage (e.g., thermal runaway) to the heater component in the event of overheating, etc.

While described as a physical device, the ECC control panel may be implemented as a logical entity (e.g., a program executing using a number of printed circuit board components (not shown)). For example, an IHS (e.g., 230A) may host a program that provides the functionality of the ECC control panel.

In one or more embodiments, the ECC control panel may include one or more temperature sensors. The ECC control panel may include other types of sensors (e.g., humidity sensors, vibration sensors, corrosion sensors, differential pressure sensors, etc.) without departing from the scope of the invention. In one or more embodiments, one end of a temperature sensor may be operatively connected to at least one of the components (e.g., IHSs (230A, 230B)) within the system (e.g., 100, FIG. 1) to detect a temperature within the system (e.g., 100, FIG. 1). The other end of the temperature sensor may be operatively connected to the ECC control panel, in which the ECC control panel is configured to manage the components based on the temperature within the system (e.g., 100, FIG. 1).

In one or more embodiments, the UCC (240) may include a power distribution control unit (not shown) that is configured to determine which component(s) within the system (e.g., 100, FIG. 1) receive power from a modular power supply component (not shown). For example, when the heater component needs to be activated, the modular power supply component may be instructed (e.g., by the power distribution control unit) to distribute power to the heater component. As yet another example, the modular power supply component may be instructed to distribute power to the IHSs (230A, 230B).

In one or more embodiments, the modular power supply component may be designed by considering geographic factors of the customer site and custom requirements of the customer. The factors and the requirements may include, for example (but not limited to): a hurricane rating of a location, a required number of UPSs to support an operation, a required number of physical devices in a MECC, a required resiliency of a MECC, a required input power frequency, a required input voltage, etc.

The aforementioned examples are not intended to limit the scope of the invention.

In one or more embodiments, the modular power supply component may obtain customer facility's power (which comes from a centralized power station) and then may distribute the power (i.e., provide the power) to one or more components of the system (e.g., 100, FIG. 1).

In one or more embodiments, the modular power supply component may provide DC power to the components. The modular power supply component may include functionality to convert AC power (obtained from the centralized power station) to DC power.

In one or more embodiments, the modular power supply component may provide "N" or "2×N" power supply resiliency. In one or more embodiments, "N" resiliency may refer to having an exact number of components to operate. For example, if the system (e.g., 100, FIG. 1) needs "N" components to operate and if the system (e.g., 100, FIG. 1) has "N" components, this means that the system (e.g., 100, FIG. 1) has "N" resiliency. As yet another example, if the system (e.g., 100, FIG. 1) has "2×N" power supply resiliency, this means that the modular power supply component has a functionality to provide twice the amount of power needed for the system (e.g., 100, FIG. 1).

Further, if the modular power supply component provides a single power supply feed, then the system (e.g., 100, FIG. 1) will have a low level of resiliency. If there is an additional power supply feed (e.g., a separate busway), then the system (e.g., 100, FIG. 1) will have a high level of resiliency. Having an additional power capacity (e.g., having a redundant UPS, having a redundant battery, etc.) may ensure that the system (e.g., 100, FIG. 1) has no downtime while performing a service maintenance or experiencing a failure (e.g., a hardware failure, a software failure, etc.).

In one or more embodiments, apart from the modular power supply component, the power distribution control unit may include one or more backup power resources (e.g., batteries) to support an uninterrupted service (e.g., a temperature detection service, a power distribution management service, etc.) of the UCC (240).

In one or more embodiments, the UCC (240) may also include an access control unit (not shown) that is configured to control one or more security devices that are placed at various locations on the system (e.g., 100, FIG. 1). In one or more embodiments, a security device may be, for example (but not limited to): a padlock, a badge reader, an electrified mortise lock, a biometric reader-based access contact, etc. By using, for example, a biometric reader-based access contact, the access control unit may control access provided by access doors (ADs, discussed below) (258A-258C).

The aforementioned example is not intended to limit the scope of the invention.

In one or more embodiments, the access control unit may include a blank space (with power) to plug-in third-party security devices. If a customer has an existing security system at a customer site, the customer may install (e.g., mount) the existing security system within the blank space. In this manner, the customer may have a flexibility to use built-in security devices of the UCC (240) and/or to use the existing security system for access control.

As used herein, "mounting" a particular component on another component refers to positioning the particular component to be in physical contact with the other component, such that the other component provides structural support, positioning, structural load transfer, stabilization, shock absorption, some combination thereof, or the like with regard to the particular component.

Those skilled in the art will appreciate that while the IHSs (230A, 230B) and the UCC (240) are shown as located on a particular side of the MITC (220), the IHSs (230A, 230B) and the UCC (240) may be located on any other side of the MITC (220) without departing from the scope of the invention.

In one or more embodiments, the MITC (220) includes the AD (258A). Similarly, the UCC (240) includes the AD (258B). In one or more embodiments, the ADs (258A, 258B) may be walk-in doors or walk-up doors. For example, as a walk-in door, the AD (258A) may permit user access to the UCC (240). As yet another example, as a walk-in door, the AD (258B) may permit user access to an internal environment of the MITC (220).

The aforementioned examples are not intended to limit the scope of the invention.

In one or more embodiments, a walk-up door may be a mechanical "reach through" structure, in which "walk-up" refers to not being able to walk inside of, for example, the MECC (210). Said another way, the walk-up door (258C) has not enough space for a customer to step inside of the MECC (210). However, using the walk-up door (258C), the customer may access substantially a portion of an ECC (e.g., a direct expansion (DX) coil (245)) to perform a service type of event.

In one or more embodiments, the service type of event may include, for example (but not limited to): changing an actuator, changing a filter, changing a sensor, etc. In one or more embodiments, because the customer not being able to walk inside of the MECC (210), the customer may perform the event while standing outside of the MECC (210).

The aforementioned examples are not intended to limit the scope of the invention.

In one or more embodiments, a walk-in door may be a mechanical "walk through" structure, in which "walk-in" refers to being able to walk inside of, for example, the MECC (210) to perform at least a service type of event. In one or more embodiments, the walk-in door has a greater depth than the walk-up door. Said another way, the walk-in door has enough space (e.g., a walk-in space) for a customer to step inside of the walk-in door.

In one or more embodiments, for example, the AD (258A) includes a handle (not shown) that makes easier to open or close the AD (258A) to walk through or reach through the internal environment of the MITC (220). In this manner, the customer may perform a service type of event without standing outside of the MITC (220).

The aforementioned example is not intended to limit the scope of the invention.

In one or more embodiments, the ADs (258A-258C) may be wicket doors (e.g., a door in a door), in which the ADs (258A-258C) both include a person door and a rack door. This means that the ADs (258A-258C) are big enough to pass a rack (not shown) through the ADs (258A-258C). In one or more embodiments, dotted arcs show an inward rotation or an outward rotation of the ADs (258A-258C).

Those skilled in the art will appreciate that while the ADs (258A, 258B) are shown as located on a rear side of the MITC (220) and a front side of the UCC (240), respectively, the ADs (258A, 258B) may be located on any other side of the MITC (220) and the UCC (240) without departing from the scope of the invention.

In one or more embodiments, the MITC (220) includes a connection interface, in which the connection interface is affixed to a pairing end of the MITC (220). The pairing end of the MITC (220) refers to a portion of the MITC (220) that can be paired with another component (e.g., the MECC (210)). In one or more embodiments, the connection interface of the MITC (220) includes mechanical and electrical connection components (MECCOMs) (250B). The connection interface of the MITC (220) also includes built-in airflow connection components.

In one or more embodiments, the mechanical connection components keep the MECC (210) connected to the MITC (220). The mechanical connection components also provide structural support to the MECC (210) and to the MITC (220) in case of a seismic event. The mechanical connection components may be, for example (but not limited to): steel plates with bolted connections, mechanical hard-stop components, sealing components, etc.

In one or more embodiments, "connected" may refer to "directly connected", in which there is a seal in between, for example, the connection interface of the MITC (220) and a connection interface of the MECC (210) (discussed below).

Alternatively, "connected" may refer to "connected via one or more physical components in between". For example, the connection interface of the MITC (220) is connected to the connection interface of the MECC (210), in which at least one physical component is mechanically touching the connection interfaces.

In one or more embodiments, the electrical connection components may transmit or receive power and data (e.g., temperature data, humidity data, etc.) to or from the MECC (210). For example, the UCC (240) may collect a temperature of one or more components within the MITC (220) as temperature data. Based on the collected data, the UCC (240) may activate or deactivate the MECC (210) using the electrical connection components.

In one or more embodiments, the airflow connection components may be ducting components that allow using either standard or custom designed MECCs. The airflow connection components may change (e.g., twist) a direction of an airflow formed between the MECC (210) and the MITC (220). For example, the MECC (210) may include a cold air ducting component and a hot air ducting component. The cold air ducting component may supply cold air into the MITC (220). The hot air ducting component may remove hot air from the MITC (220) and may deliver the hot air to the MECC (210).

The aforementioned examples are not intended to limit the scope of the invention.

As used herein, a "ducting component" includes any tube, pipe, conduit, or a combination thereof, that has one or more passageways through which a fluid or a gas can be conveyed. Examples of materials for a ducting component may include a cloth, a fabric, an extruded metal, a sheet metal, a polymer, or a combination thereof. A passageway of a ducting component may have any size and shape. The cross-section of a ducting component may be square, round, ovate, rectangular, or irregular. Further, a passageway of a ducting component may have a constant or changing cross-section, or a cross-section that changes over the length of the passageway.

In one or more embodiments, an area (e.g., height×width) enclosed by the connection interface of the MITC (220) is equal to an area enclosed by the connection interface of the MECC (210). In this manner, an end-to-end pairing between the MITC (220) and the MECC (210) may be installed for compatible mechanical, electrical, and airflow connections.

The MECC (210) may include one or more physical devices (e.g., ECCs) that alter characteristics (e.g., airflow directions, humidity of air, and temperature levels, etc.) of the internal environment of the MITC (220) at a macroscopic level. The physical devices may also ensure reliability of the IHSs (230A, 230B) and the UCC (240). In one or more embodiments, the physical devices may be affixed to a floor (e.g., a bottom side) of the MECC (210). In one or more embodiments, a physical device may be, for example (but not limited to): a fan (255), a DX coil (245), a fluid mixture unit, a heater component, an immersion cooling component, etc.

The aforementioned example is not intended to limit the scope of the invention.

In some cases, the system (e.g., 100, FIG. 1) may be deployed to environments that result in the temperature levels of the IHSs (230A, 230B) and the UCC (240) being outside of their designed operating temperature levels. For example, the IHSs (230A, 230B) may be designed to operate at temperature levels above 0° C. When the system (e.g., 100, FIG. 1) is deployed to an environment with harsh conditions (e.g., −40° C.-60° C.), the IHS (230A, 230B) may not operate properly and, in certain scenarios, may be damaged. To prevent the aforementioned issue, depending on environmental conditions, the physical devices either cool or heat the internal environment of the MITC (220). In this manner, stability and functionality of the IHSs (230A, 230B) and the UCC (240) may be preserved.

In one or more embodiments, as a gas mover, the fan (255) may be able to change a rate of gases being taken into and expelled from the IHSs (230A, 230B) and the UCC (240). As a refrigerant-based cooling technology, the DX coil (245) may cool the internal environment of the MITC (220) using a condensed refrigerant liquid (e.g., liquid nitrogen, hydrofluorocarbons (HFCs), etc.). In this technology, the refrigerant may expand to generate a cooling effect in the DX coil (245) that is in direct contact with a conditioned air, which will be supplied to the internal environment of the MITC (220).

In one or more embodiments, as a liquid cooling component, the fluid mixture unit may pump cooled fluid mixture (e.g., a mixture of water and glycerol) throughout hardware components (not shown) of the IHSs (230A, 230B) and the UCC (240). An absorbed air by the fluid mixture may then be transferred to an external environment of the MITC (220). Similar to refrigerant-based cooling technology, the fluid mixture unit may also use a DX coil; however, instead of using a refrigerant, the fluid mixture unit uses the fluid mixture. In one or more embodiments, glycerol may behave like an antifreeze liquid, in which the fluid mixture may operate at temperatures below 0° C.

In one or more embodiments, the MECC (210) may also take advantage of a cooling infrastructure that is already built-in at a customer site. For example, the MECC (210) may use a chilled water loop that is already available at the customer site.

As used herein, an "infrastructure" means system, components, or elements of a system that provide resources for a computing device, such as electrical power, data exchange capability with external systems, air, heat removal, and environmental control.

In one or more embodiments, the heater component may bring hardware components of the IHSs (230A, 230B) and the UCC (240) into their appropriate operating temperature levels (e.g., above 0° C.) when necessary. To initiate a heating process, the heater component may obtain a required power from the modular power supply component. The heater component may be made of silicon rubber, any other material, and/or any combination thereof that enables the heater component to perform its functions. Those skilled in the art will appreciate that the heater component may be supplied with power directly or indirectly (e.g., via a heating control component, a printed circuit board, etc.) without departing from the scope of the invention.

In one or more embodiments, the heater component has a number of surfaces that is heated and when air passes through the surfaces, an induced heat may be transferred from the heater component to the volume of air drawn into the internal environment of the MITC (220). In one or more embodiments, a number of heat sinks (not shown) may be used to provide a uniform distribution of heated volume of air drawn into the internal environment of the MITC (220) through their fins, in which a bottom portion of the number of heat sinks is affixed to the heater component. In this manner, a surface area of the heater component may be expanded indirectly to increase an efficiency of the heater component.

In one or more embodiments, the MECC (210) may provide "N+1" or "N+2" heating and/or cooling resiliency. In one or more embodiments, "N+1" cooling resiliency may indicate that even if one of the physical devices is deactivated (because of a service maintenance), the IHSs (230A, 230B) may still operate. For example, the MECC (210) has four fans and the MECC (210) has "N+1" resiliency. In this case, the required number of fans to support operation of the IHSs (230A, 230B) is three and the MECC (210) has a redundant fan. Having additional heating and/or cooling capacity (e.g., having a redundant fan, having a redundant heater component, etc.) may ensure that the IHSs (230A, 230B) has no downtime while performing a service maintenance or experiencing a failure.

In one or more embodiments, a power usage effectiveness (PUE) value of a component (e.g., an ECC, an IHS, etc.) at a data center indicates how energy efficient the component is. For example, as an ideal case, if a PUE value of an ECC is equal to one, this means that the ECC uses 100% of an input power that is provided to the ECC. In general, a PUE value of an ECC at a traditional data center is on average 1.57 (e.g., 64% effectiveness). Comparing to the PUE value of the ECC at the traditional data center, a PUE value of the MECC (210) is on average 1.01 (e.g., 99% efficiency)-1.043 (e.g., 95% efficiency), depending on where the system (e.g., 100, FIG. 1) is deployed. For example, if the system (e.g., 100, FIG. 1) is deployed to a hot environment (e.g., Phoenix, AZ), the PUE value of the MECC (210) may be 1.043. As yet another example, if the system (e.g., 100, FIG. 1) is deployed to a mild (e.g., neither hot nor cold) environment (e.g. San Diego, CA), the PUE value of the MECC (210) may be 1.01.

The aforementioned example is not intended to limit the scope of the invention.

In one or more embodiments, the MECC (210) supplies cold air (shown with a dashed line arrow) to the internal environment of the MITC (220) (including the UCC (240)) via the built-in airflow connection components. The MECC (210) also removes hot air (shown with a solid line arrow) from the internal environment of the MITC (220) (including the UCC (240)) via the built-in airflow connection components. In one or more embodiments, the dashed line and the solid line arrows inside of the MITC (220) may be referred to as a "cold aisle" and a "hot aisle", respectively.

The cold aisle may refer to an area (e.g., a space) in which conditioned (e.g., cold) air is introduced to a front side of the IHSs (230A, 230B) and to the UCC (240) to remove heat. The cold air may also be introduced to other components located within the internal environment of the MITC (220) without departing from the scope of the invention.

The hot aisle may refer to an area in which conditioned (e.g., hot) air is removed from a rear side of the IHSs (230A, 230B) and from the UCC (240) for the reliability of the IHSs (230A, 230B) and the UCC (240). The hot air may also be removed from other components located within the internal environment of the MITC (220) without departing from the scope of the invention.

In one or more embodiments, similar to MITC (220), the MECC (210) includes the AD (258C). In one or more embodiments, the AD (258C) may be a walk-in door or a walk-up door (as discussed above). For example, as a walk-in door, the AD (258C) may permit user access to the MECC (210).

The aforementioned example is not intended to limit the scope of the invention.

Those skilled in the art will appreciate that while the AD (258C) is shown as located on a right side of the MECC (210), the AD (258C) may be located on any other side of the MECC (210) without departing from the scope of the invention.

In one or more embodiments, as being separate components and as having separate ADs, once paired, the MITC (220) and the MECC (210) provide an additional security measure to the user access. For example, user 1 has access to the AD (258C) and user 2 has access to the ADs (258A-258C). In this case, because user 2 has access to all ADs, user 2 can access to the UCC (240), the MITC (220), and the MECC (210). However, because user 1 has access only to the AD (258C), user 1 cannot access to the UCC (240) and to the MITC (220).

The aforementioned example is not intended to limit the scope of the invention.

In one or more embodiments, similar to the MITC (220), the MECC (210) includes a connection interface, in which the connection interface is affixed to a pairing end of the MECC (210). The pairing end of the MECC (210) refers to a portion of the MECC (210) that can be paired with another component (e.g., the MITC (220)). In one or more embodiments, similar to the MITC (220), the connection interface of the MECC (210) includes MECCOMs (250A). The connection interface of the MECC (210) also includes the built-in airflow connection components.

In one or more embodiments, the MITC (220) and the MECC (210) are oriented in a same direction. Further, a double-headed arrow shows modularity of the system (e.g., 100, FIG. 1), in which the MECC (210) may be attached to, or detached from the MITC (220) along the same direction.

Those skilled in the art will appreciate that while the IHSs (230A, 230B) are oriented in parallel to the MECCOMs (250B), the IHSs (230A, 230B) may be oriented in any direction without departing from the scope of the invention.

In one or more embodiments, the end-to-end and medium form factor (e.g., medium shape) of the MDC (the system (e.g., 100, FIG. 1)) described in FIGS. 1 and 2.1 makes the system (e.g., 100, FIG. 1) deployable to, for example (but not limited to): space-unlimited locations, remote locations, etc. The space-unlimited locations may be, for example (but not limited to): university campuses, research and development locations, etc. The remote locations (e.g., edge locations) may be locations that are away from specialized IT and security personnel to maintain an operation of the MDC.

Providing multiple functionalities and fitting these functionalities into the medium form factor make formation, deployment, and operation of the end-to-end MDC easier for a customer that needs higher computing power. These functionalities also make possible to move from centralized cloud computing to decentralized edge computing. These functionalities may include, for example (but not limited to): a pre-integrated and ready-to-use IHS, an ability to plug into an existing security system, multiple ECC options, a high power resiliency, an optimized power distribution, higher power density within a data center, an easy service access, flexibility to support third-party components, a customer-specific component design, etc.

Further, a physical and functional split between the MECC (210) and the MITC (220) enables a variety of cooling technologies, capacities, and resiliencies to be paired with a variety of power capacities, resiliencies, and IHS technologies.

Turning now to FIG. 2.2, FIG. 2.2 shows a diagram of the IHS (230A) in accordance with one or more embodiments of the invention. The IHS (230A) may include a rack (260) and any number of computing devices (e.g., 270).

In one or more embodiments, the rack (260) may be a mechanical structure that enables the computing devices to be positioned with respect to one another. For example, the rack (260) may be a mountable enclosure that enables the computing devices to be disposed within the rack (260). The rack (260) may be implemented as other types of structures adapted to host, position, orient, and/or otherwise physically, mechanically, electrically, and/or thermally manage the computing devices. By managing the computing devices, the rack (260) may enable the computing devices to be densely packed in a space without negatively impacting the operation of the IHS (230A).

In one or more embodiments, the rack (260) may include one or more mounting holes (MHs) (265A-265D). Additional details of the MHs are described below in reference to FIG. 3.1.

In one or more embodiments, a computing device (e.g., 270) may be a mechanical structure for housing components of the IHS (230A). For example, the computing device (e.g., 270) may be implemented as a rack-mountable enclosure for housing components of the IHS (230A). The computing device (e.g., 270) may be adapted to be disposed within the rack (260) and/or utilize services provided by the rack (260) and/or other components available in the system (e.g., 100, FIG. 1).

In one or more embodiments, a computing device positioned into a pre-integrated rack may be ready-to-use (e.g., pre-configured with software, hardware, etc.) when deployed to the customer site. However, the customer may alter a configuration of the pre-configured computing device after the deployment. For example, the customer may increase memory capacity of the computing device after the deployment. As yet another example, the customer may increase processor capacity of the computing device after the deployment.

The aforementioned examples are not intended to limit the scope of the invention.

In one or more embodiments, a set of isolators (e.g., 420A, FIG. 4) may be attached to the components (e.g., the IHSs (e.g., 230A, 230B, FIG. 2.1), the floor, the MORC (e.g., 402, FIG. 4), etc.) of the system (e.g., 100, FIG. 1) to make sure that the components are ready-to-use when they deployed to the customer site. In one or more embodiments, the set of isolators provides a shock isolation to the components such that the components may be protected from any damage (e.g., a vibrational damage). Additional details of the set of isolators are described below in reference to FIG. 3.1.

Turning now to FIG. 2.3, FIG. 2.3 shows a diagram of the computing device (270) in accordance with one or more embodiments of the invention. In one or more embodiments, the computing device (270) includes six sides (i.e., top, bottom, right, left, front, and rear), in which air drawn into from a front side of the computing device (e.g., via an air inlet (280)) and expelled from the rear side of the computing device (e.g., via one or more ECCs). An airflow direction is shown with a dashed line arrow (cold air) and a solid line arrow (hot air). In general, air incoming from the front side of the computing device (270) is cooler than air outgoing from the rear side of the computing device (270).

In one or more embodiments, to provide services, the computing device (270) may utilize resources provided by a number of hardware components hosted within the computing device (270). The hardware components may be, for example (but not limited to): processors, non-persistent storage devices, printed circuited boards, persistent storage devices, peripheral components interconnects, special purpose hardware components, etc. In one or more embodiments, some of the hardware components may be omitted or additional hardware components may be added based on the services provided by the computing device (270).

The aforementioned example is not intended to limit the scope of the invention.

As used herein, "computing" refers to any operations that may be performed by a computer, including (but not limited to): computation, data storage, data retrieval, communications, etc.

As used herein, a "computing device" includes any of various devices in which a computing operation may be carried out. A computing device may be, for example (but not limited to): a compute IHS component, a storage IHS component, a network device, a telecommunications component, etc.

The aforementioned examples are not intended to limit the scope of the invention.

In one or more embodiments, the medium form factor of the system described in FIG. 2.1 may increase a PUE value of the computing device (270). For example, because the system described in FIG. 2.1 includes a separate cooling and/or heating unit (210), the computing device (270) may not have a fan and/or a heating component. In this manner, the computing device (270) may become more power dense and power-efficient.

FIGS. 3.1-3.3 show side views of a portion of the MITC (e.g., 220, FIG. 2.1) in accordance with one or more embodiments of the invention.

Turning now to FIG. 3.1, FIG. 3.1 shows a side view of a portion of the MITC (e.g., 220, FIG. 2.1) in accordance with one or more embodiments of the invention. In an embodiment of the invention shown in FIG. 3.1, the embodiment includes a rack (305), a MORC (310), a first tray (e.g., a cable tray, a network cable tray, etc.) (320), a second tray (341), a busway plug (337), a rack mounting component (RMC) (330), and a track system. The rack (305) may be a rack of the IHS (230A) as discussed above in reference to FIG. 2.1.

In one or more embodiments, similar to the computing device (e.g., 270, FIG. 2.3), the MORC (310) includes six sides, in which the first tray (320) is affixed to the front side of the MORC (310) and the second tray (341) is affixed to the rear side of the MORC (310).

In one or more embodiments, the first tray (320) includes a first holder (e.g., holder (325)) and a first basket (e.g., basket (327)). As being mechanical support components, both the first holder (325) and the first basket (327) are configured to carry cables (e.g., power cables, network cables, etc.) that are routed from one component (e.g., a network switch, a busway plug (337), etc.) to another component (e.g., a network router, a computing device, etc.) for power distribution, control, and communication. Further, the first holder (325) and the first basket (327) are configured to prevent cable congestion at the front side of the rack (305) for a better cable management.

For example, a network cable may be routed directly from the first tray (320) to a line card (e.g., a modular electronic circuit interfacing with a network) included in the rack (305). In this manner, the first tray (320) may help the network communication between the network switch and the computing devices disposed within the rack (305). As yet another example, a power cable (e.g., a busway whip) may be routed directly from the first tray (320) to a power distribution unit (PDU) placed at the front side of the rack (305). In this manner, the first tray (320) may help distribution of power to components disposed within the rack (305).

The aforementioned examples are not intended to limit the scope of the invention.

As used herein, a "cable" includes any cable, conduit, or line that carries one or more conductors and that is flexible over at least a portion of its length. A cable may include a connector portion, such as a plug, at one or more of its ends.

In one or more embodiments, a "PDU" is a component with multiple outlets designed to distribute (e.g., to transfer) power, from a power source (e.g., a modular power supply component), to components disposed within the rack (305). In one or more embodiments, the components may be, for example (but not limited to): computing devices, network switches, storage devices, etc. To compare, for example, a UPS provides battery backup to a network switch during power outages. A UPS also filters incoming power to the network switch and provides a surge protection. However, a PDU distributes power from a UPS (or from a different type of power supply component) to the network switch, which means the PDU does not generate or condition power on its own.

The aforementioned example is not intended to limit the scope of the invention.

To distribute power and/or to enhance remote power management in various structural conditions, PDUs may be manufactured in a variety of styles, for example (but not limited to): a local metered PDU, a monitored PDU, a switchable PDU, a hot-swap PDU, a network switch added PDU, etc. In one or more embodiments, the various structural conditions may include, for example (but not limited to): a type of a rack, a required input power to feed a component within a rack, a plug type of a component, etc.

In many cases, the rack (305) may be configured with multiple PDUs for various reasons, for example (but not limited to): power redundancy, power sharing, power cable management, etc.

The aforementioned examples are not intended to limit the scope of the invention.

In one or more embodiments, a "busway plug" is a premanufactured, movable component that plugs into a busway (e.g., a bus duct) to provide (i) a localized power distribution and (ii) a power surge protection to the components within the MITC (e.g., 220, FIG. 2.1). To protect a component against a power surge (e.g., a power overload), a busway plug may use, for example (but not limited to): a fuse, a circuit breaker, etc.

The aforementioned example is not intended to limit the scope of the invention.

In one or more embodiments, a "busway" is a premanufactured, movable power distribution system consisting of bus bars (and other components) in a protective enclosure. A busway may transfer power and may connect to an electrical device such as a switchgear, a panelboard, and a transformer. In one or more embodiments, bus bars (e.g., aluminum or copper conductors) and other components (e.g., elbows, offsets, etc.) may help to properly route a busway to an electrical connection point or to a termination point.

As an alternative approach to provide power to a component, comparing to power cables (or power conduits), busways are not resource-intensive to install and are easier to move, particularly when load locations in a system are likely to change. To operate in different environments (e.g., data centers, laboratories, petrochemical sites, etc.), busways may be manufactured in a variety of styles, for example (but not limited to): a non-segregated busway, a sandwich-style busway, a track busway, an air-insulated busway, etc.

The aforementioned example is not intended to limit the scope of the invention.

In one or more embodiments, similar to the first tray (320), the second tray (341) includes a second holder (e.g., holder (343)) and a second basket (e.g., basket (342)). As being mechanical support components, both the second holder (343) and the second basket (342) are configured to carry cables that are routed from one component to another component for power distribution, control, and communication. Further, the second holder (343) and the second basket (342) are configured to prevent cable congestion at the rear side of the rack (305) for a better cable management.

For example, a second network cable may be routed directly from the second tray (341) to the line card included in the rack (305). In this manner, the second tray (341) may help the network communication between the network switch and the computing devices disposed within the rack (305). As yet another example, a busway whip (340) may be routed directly from the second tray (341) to a second PDU placed at the rear side of the rack (305). In this manner, the second tray (341) may help distribution of power to components disposed within the rack (305).

The aforementioned examples are not intended to limit the scope of the invention.

In one or more embodiments, the holders (e.g., 325, 343, etc.) and the baskets (e.g., 327, 342, etc.) may be made of, for example (but not limited to): galvanized steel, stainless steel, aluminum, glass-fiber reinforced plastic, etc.

In one or more embodiments, to prevent cable congestion at the rear side of the rack (305) and to provide a better cable management, for example, the busway whip (340) may be clipped (e.g., fastened) to one of the track components (TCs) (e.g., 312) of the track system (discussed below). Similarly, to prevent cable congestion at the front side of the rack (305) and to provide a better cable management, for example, a network cable may also be clipped to one of the TCs (e.g., 312) of the track system. In one or more embodiments, a cable may be clipped to one of the TCs (e.g., 312) of the track system using, for example (but not limited to): a cable fastener, a cable tie, etc.

The aforementioned examples are not intended to limit the scope of the invention.

Those skilled in the art will appreciate that while the baskets (327, 342) and the holders (325, 343) are shown as having a particular size, shape, and placement, the baskets (327, 342) and the holders (325, 343) may have any size, shape, and placement (while still providing the same functionalities) without departing from the scope of the invention.

In one or more embodiments, the MORC (310) includes a set of isolators (e.g., 315) to make sure that the MORC (310) (and information technology components (ITCs) mounted within) are ready-to-use when the system (e.g., 100, FIG. 1) is deployed to the customer site. In one or more embodiments, the set of isolators (e.g., 315) provides a shock isolation to the MORC (310) such that the ITCs may be protected from any damage.

Figure 4:
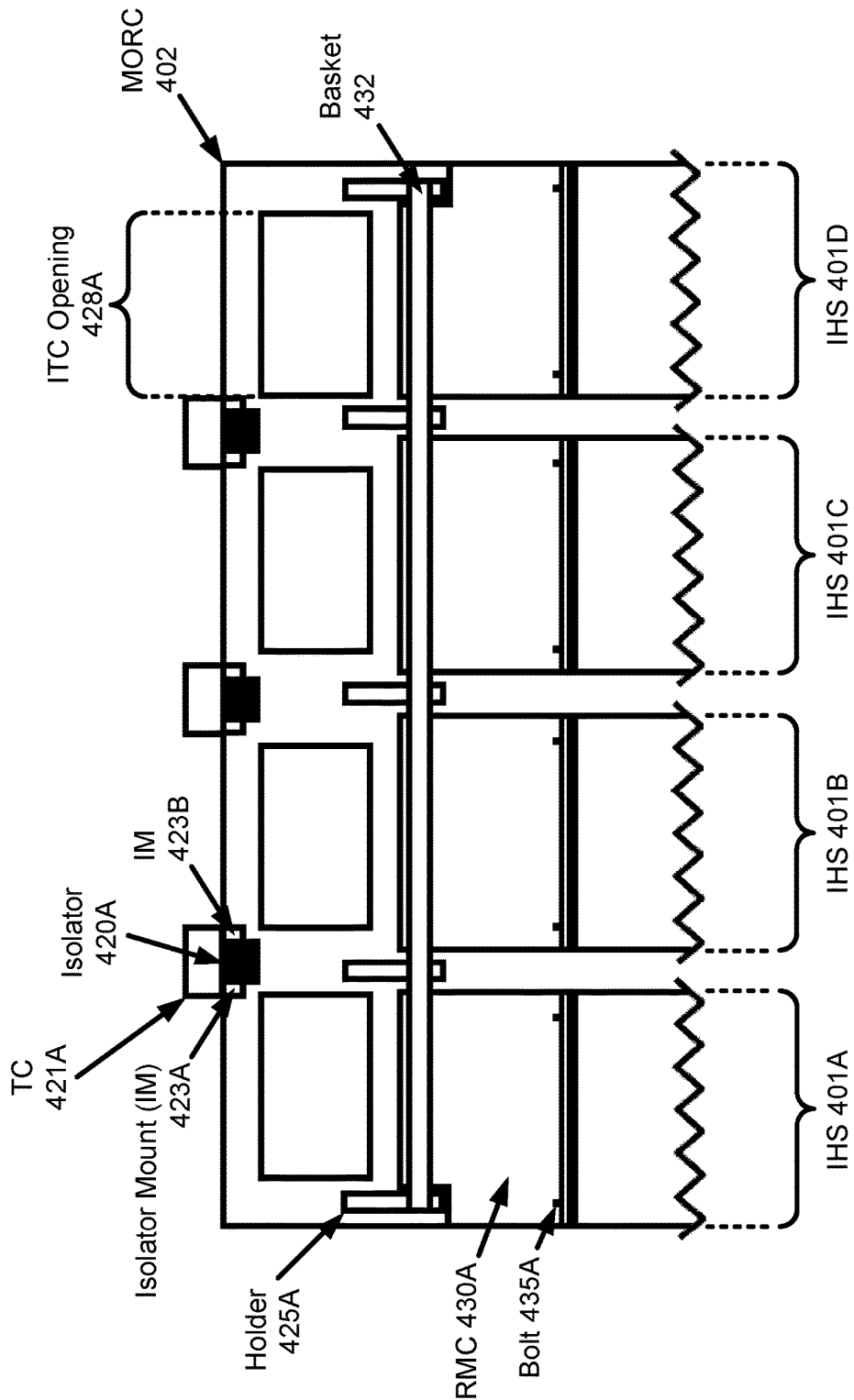
FIG. 4 shows a front view of a portion of an MITC in accordance with one or more embodiments of the invention.

In one or more embodiments, the track system includes one or more TCs (e.g., 312) (see FIG. 4). Each TC is a metal framing component (e.g., a strut channel, a unistrut channel, etc.). Similar to the MORC (310), each TC includes six sides, in which the top side of each TC is affixed (e.g., welded) to the ceiling of the MITC (e.g., 220, FIG. 2.1).

In one or more embodiments, each isolator also includes six sides, in which the bottom side of each TC is affixed to a top side of a corresponding isolator. More specifically, the bottom side of each TC is affixed to isolator mounts (IMs) of a corresponding isolator (see FIG. 4). In one or more embodiments, each TC acts as a mechanical hard-stop component. In this manner, the tracking system may provide structural support to the set of isolators (e.g., 315) in case of a seismic event. The tracking system may also provide structural support to the set of isolators (e.g., 315) (i) to keep the set of isolators (e.g., 315) connected to the tracking system and (ii) to connect one isolator to another isolator.

In one or more embodiments, the track system and the rack (305) are oriented in a first direction, and the MORC (310) is oriented in a second direction, in which the first direction and the second direction are perpendicular to each other. The track system, the rack (305), and the MORC (310) may be oriented differently with respect to each other (see FIGS. 5.1-5.3) without departing from the scope of the invention. In one or more embodiments, because the track system is affixed to the IMs of the set of isolators (e.g., 315), even if the track system is oriented in the second direction, the track system stays affixed to the set of isolators (e.g., 315).

In one or more embodiments, in order to secure (e.g., to restrain) the rack (305) to the MORC (310), the RMC (330) may be a bracket (e.g., an L bracket) that includes two portions. For example, a first portion of the RMC (330) refers to a portion of the RMC (330) that is secured to the MHs (e.g., 265B, 265D, FIG. 2.2) to affix the RMC (330) to the top side of the rack (305). A second portion of the RMC (330) refers to a portion of the RMC (330) that is secured to a set of MHs (not shown) located on the front side of the MORC (310) to secure the RMC (330) to the front side of the MORC (310).

In one or more embodiments, the first portion of the RMC (330) includes a first set of holes (not shown) that allows bolts (e.g., 335) to pass through and interface with the MHs (e.g., 265B, 265D, FIG. 2.2). When the first set of holes is aligned with the MHs (e.g., 265B, 265D, FIG. 2.2), the bolts (e.g., 335) are used to secure the RMC (330) to the top side of the rack (305).

Further, the second portion of the RMC (330) includes a second set of holes (not shown) to be aligned with the set of MHs. The second set of holes allows a set of bolts (not shown) to pass through and interface with the set of MHs. When the second set of holes is aligned with the set of MHs, the set of bolts is used to secure the RMC (330) to the front side of the MORC (310). In this manner, the rack (305) is secured to the MORC (310).

In one or more embodiments, the RMC (330) acts as a mechanical hard-stop component. In this manner, the RMC (330) may provide structural support to the rack (305) in case of a seismic event. The RMC (330) may also provide structural support to the rack (305) to keep the rack (305) connected to the MORC (310). Additional details of the RMC are described below in reference to FIG. 4.

In one or more embodiments, the RMC (330) may be, for example (but not limited to): a blanking panel, a close-out panel, a plastic curtain, a Plexiglas sheet, a sheet metal, etc.

Those skilled in the art will appreciate that while a single RMC (330) is affixed to the front side of the MORC (310) and to the top side of the rack (305), an additional RMC may be affixed to the rear side of the MORC (310) and to the top side of the rack (305) without departing from the scope of the invention. In this manner, (i) a level of structural support to the rack (305) may be increased and (ii) cooling efficiency of the MECC (e.g., 210, FIG. 2.1) may be improved.

Those skilled in the art will appreciate that while the bolts (e.g., 335) are used to secure the RMC (330) to the top side of the rack (305) and to the front side of the MORC (310), any other mechanical or non-mechanical components may be used to secure the secure the RMC (330) to the top side of the rack (305) and to the front side of the MORC (310) without departing from the scope of the invention.

Those skilled in the art will appreciate that while the RMC (330) is shown as a bracket, the RMC (330) may be in another shape (while still providing the same functionalities) without departing from the scope of the invention.

Those skilled in the art will appreciate that while the RMC (330) is shown as a single (e.g., a monolithic) component, the RMC (330) may be manufactured as having at least two components (while still providing the same functionalities) without departing from the scope of the invention.

In one or more embodiments, the MORC (310) may have a functionality to be repositioned along the length of the track system. More specifically, a customer may move (e.g., shift, slide, etc.) the MORC (310) along the length of the track system (shown with arrows) towards to the front side or towards to the rear side of the rack (305). This means that the MORC (310) is not welded to the track system. For example, in order to perform complex tasks (e.g., parallel processing in a distributed computing system), more computing devices (e.g., 230A, FIG. 2.1) may be disposed within the rack (305), in which more busway whips (e.g., 340) may need to be routed from the busway plug (337) to the rack (305). To prevent cable congestion at the front side of the rack (305) and to provide a better cable management, the MORC (310) and its components (e.g., the holders (325, 343), the baskets (327, 342), etc.) may be repositioned (see FIGS. 3.2 and 3.3) along the length of the track system. In this manner, for example, a larger basket at the front side of the rack (305) may be provided.

The aforementioned examples are not intended to limit the scope of the invention.

Turning now to FIG. 3.2, FIG. 3.2 shows a side view of a portion of the MITC (e.g., 220, FIG. 2.1) in accordance with one or more embodiments of the invention. In an embodiment of the invention shown in FIG. 3.2, the MORC (310) is shifted forward from a first position to a second position along the length of the track system (shown with an arrow), in which the second position is much closer to the rear side of the rack (305). Before repositioning the MORC (310) from the first position to the second position, mechanical (or non-mechanical) connection components that keep the MORC (310) in place may be loosened. After the repositioning, in order to restrict movement of the MORC (310) along the length of the track system, the MORC (310) may be re-secured to the track system. Further, while the embodiment still includes the busway whip (e.g., 340, FIG. 3.1) and the busway plug (e.g., 337, FIG. 3.1), these components are not shown in FIG. 3.2 for a clearer illustration.

In one or more embodiments, after the repositioning, sizes of the holders (325, 343), the baskets (327, 342), and the first portion of the RMC (330) may be adjusted (either by expanding or by shrinking) in order to provide the same functionalities to the rack (305) and to other components within the MITC (e.g., 220, FIG. 2.1). For example, once the MORC (310) is shifted to the second position, the first holder (325), the first basket (327), and the first portion of the RMC (330) become larger (comparing to their sizes in FIG. 3.1), whereas the second basket (342) and the second holder (343) become smaller (comparing to their sizes in FIG. 3.1). In one or more embodiments, even though the first portion of the RMC (330) becomes larger, the RMC (330) stays affixed to the MORC (310) and to the rack (305). In this manner, even if the RMC (330) changes its size, the RMC (330) still acts as an air containment component (discussed below in reference to FIG. 4), and still provides structural support to the rack (305) and to the MORC (310).

Similarly, even if the holders (325, 343) and the baskets (327, 342) change their sizes, the holders (325, 343) and the baskets (327, 342) still carry cables from one component to another component, and still act as cable management components.

In one or more embodiments, if the RMC (330) is a monolithic component, once the MORC (310) is shifted to the second position, the RMC (330) may be replaced with a second monolithic RMC (which has a larger first portion) to accommodate the alteration in the position of the MORC (310). In this case, the second monolithic RMC acts as an air containment component, and provides structural support to the rack (305) and to the MORC (310).

In one or more embodiments, after repositioning the MORC (310) to the second position, the MORC (310) may be shifted forward to a position (along the length of the track system) which is much closer to the rear side of the rack (305) (see FIG. 3.3), or may be shifted backward to a position which is away from the second position without departing from the scope of the invention.

Turning now to FIG. 3.3, FIG. 3.3 shows a side view of a portion of the MITC (e.g., 220, FIG. 2.1) in accordance with one or more embodiments of the invention. In an embodiment of the invention shown in FIG. 3.3, the MORC (310) is shifted forward from the second position to a third position along the length of the track system (shown with an arrow), in which the third position is much closer to the rear side of the rack (305). Before repositioning the MORC (310) from the second position to the third position, mechanical (or non-mechanical) connection components that keep the MORC (310) in place may be loosened. After the repositioning, in order to restrict movement of the MORC (310) along the length of the track system, the MORC (310) may be re-secured to the track system. Further, while the embodiment still includes the busway whip (e.g., 340, FIG. 3.1) and the busway plug (e.g., 337, FIG. 3.1), these components are not shown in FIG. 3.3 for a clearer illustration.

In one or more embodiments, after the repositioning, sizes of the holders (325, 343), the baskets (327, 342), and the first portion of the RMC (330) may be adjusted further in order to provide the same functionalities to the rack (305) and to the other components within the MITC (e.g., 220, FIG. 2.1). For example, once the MORC (310) is shifted to the third position, the first holder (325), the first basket (327), and the first portion of the RMC (330) become much larger (comparing to their sizes in FIG. 3.1), whereas the second basket (342) and the second holder (343) become much smaller (comparing to their sizes in FIG. 3.1). In one or more embodiments, even though the first portion of the RMC (330) becomes much larger, the RMC (330) stays affixed to the MORC (310) and to the rack (305). In this manner, even if the RMC (330) changes its size, the RMC (330) still acts as an air containment component, and still provides structural support to the rack (305) and to the MORC (310).

Similarly, even if the holders (325, 343) and the baskets (327, 342) change their sizes, the holders (325, 343) and the baskets (327, 342) still carry cables from one component to another component, and still act as cable management components.

As discussed above in reference to FIG. 3.2, if the RMC (330) is a monolithic component, once the MORC (310) is shifted to the third position, the RMC (330) may be replaced with a third monolithic RMC (which has a much larger first portion) to accommodate the alteration in the position of the MORC (310). In this case, the third monolithic RMC acts as an air containment component, and provides structural support to the rack (305) and to the MORC (310).

In one or more embodiments, after repositioning the MORC (310) to the third position, the MORC (310) may be shifted forward to a position (along the length of the track system) which is much closer to the rear side of the rack (305), or may be shifted backward to a position which is away from the third position without departing from the scope of the invention.

Turning now to FIG. 4, FIG. 4 shows a front view of a portion of the MITC (e.g., 220, FIG. 2.1) in accordance with one or more embodiments of the invention. In an embodiment of the invention shown in FIG. 4, the embodiment includes a MORC (402), a tray (not shown), a set of ITC openings (e.g., 428A), a set of isolators (e.g., 420A), a set of IMs (e.g., 423A, 423B, etc.), a first track system (not shown), a second track system (not shown), a set of RMCs (e.g., 430A), one or more bolts (e.g., 435A), and a set of IHSs (401A-401D). The IHS (e.g., 401A) may be the same as the IHS (230A) as discussed above in reference to FIG.

2.2. Similarly, the RMC (e.g., 430A) may be the same as the RMC (330) as discussed above in reference to FIG. 3.1. Further, the MORC (402) may be the same as the MORC (310) as discussed above in reference to FIG. 3.1.

In one or more embodiments, a first group of IHSs and a second group of IHSs are deployed to the white space within the MITC (e.g., 220, FIG. 2.1). The first group of IHSs includes, for example, four of the first type of IHSs (e.g., IHS (401A)) and the second group of IHSs includes, for example, four of the second type of IHSs (not shown). The first type of IHS includes a 1070 mm deep rack and the second type of IHS includes a 1200 mm deep rack.

In one or more embodiments, the first type of IHSs are lined up in a row, for example, to generate the first group of IHSs. Similarly, the second type of IHSs are lined up in a row (next to the first group of IHSs), for example, to generate the second group of IHSs. As used herein, a "row" means a number of components arranged in a line. A row may include components arranged in a straight line or may include components arranged in a curved line. For example, a row of IHSs may include multiple IHSs arranged in a line.

The aforementioned examples are not intended to limit the scope of the invention.

In one or more embodiments, instead of grouping the same IHSs into one group, different IHSs may be grouped into different groups. For example, instead of adding a second type of IHS into the second group of IHSs, that particular IHS may be added into the first group of IHSs. To accommodate this alteration in the first group of IHSs, without redesigning the MORC (402), the MORC (402) and its components (e.g., the holder (425A), the basket (432), etc.) may be repositioned along the length of the first track system (see FIGS. 3.1-3.3). In this manner, the MORC (402) may provide mechanical support to both types of IHSs and to subcomponents (e.g., computing devices, PDUs, etc.) of both types of IHSs.

The aforementioned example is not intended to limit the scope of the invention.

In one or more embodiments, based on the arrangement of (or grouping of) the IHSs, a first type of MORC (e.g., the MORC (402)) may be affixed to the first track system, in which the first type of MORC (402) is affixed above the first group of IHSs. Similarly, a second type of MORC (not shown) may be affixed to the second track system, in which the second type of MORC is affixed above the second group of IHSs. Comparing to the first type of MORC (402), the second type of MORC may have different structural characteristics, for example (but not limited to): a different number of ITC openings, a different number of isolators, etc.

The aforementioned example is not intended to limit the scope of the invention.

For example, the first type of MORC (402) may include four ITC openings (e.g., 428A) to be aligned with the first group of IHSs below the first type of MORC (402). As yet another example, the second type of MORC may include four ITC openings (e.g., 428A) to be aligned with the second group of IHSs below the second type of MORC.

The aforementioned examples are not intended to limit the scope of the invention.

In one or more embodiments, the ITC openings (e.g., 428A) may have a functionality to host one or more ITCs. For example, based on a customer requirement, an ITC may need be mounted to the ITC opening (e.g., 428A). An ITC may be, for example (but not limited to): a network switch, a network router, a battery, a UPS, etc. In one or more embodiments, the ITC openings (e.g., 428A) may also have a functionality to provide structural support to the ITCs in case of a seismic event. For this reason, the ITC openings (e.g., 428A) may include at least one or more mechanical hard-stops.

Those skilled in the art will appreciate that while the ITC openings (e.g., 428A) are shown as rectangular openings, the ITC openings (e.g., 428A) may be in another shape (while still providing the same functionalities) without departing from the scope of the invention.

Those skilled in the art will appreciate that while the ITC openings (e.g., 428A) are shown as having the same size (e.g., a 4 RU width) along the length of the MORC (402), the ITC openings (e.g., 428A) may have different sizes along the length of the MORC (402) without departing from the scope of the invention.

In one or more embodiments, when one or more IHSs are lined up in a row (discussed above), air from a cold air source (e.g., a cold aisle) may flow between, above, and/or below the IHSs, and may mix with air from a hot air source (e.g., a hot aisle). Air leaks of cold air or hot air between, above, and/or below the IHSs may reduce an efficiency of the MECC (e.g., 210, FIG. 2.1), and may cause the computing devices of the IHSs to receive inadequate cooling.

In some cases, hot air may mix with cold air in a cold aisle prior to the cold air being drawn into the computing devices, thus the hot air may pre-heat the cold air. In order to reduce air leaks and mixing of cold air with heated air (prior to the cold air being drawn into the computing devices), air containment components may be used.

In one or more embodiments, "air containment" refers to physical barriers used in a hot aisle and/or in a cold aisle to minimize the mixing of cold (e.g., supply) air and hot (e.g., exhaust) air. The physical barriers prevent hot "exhaust" air from flowing over the tops of the IHSs, mixing with the cold "supply" air, and thereby increase cooling capacity of the cold air. With the air containment components in place, for example, the MECC (e.g., 210, FIG. 2.1) may reduce its fan speeds and may use higher temperature chilled water. Otherwise, the MECC (e.g., 210, FIG. 2.1) may need to operate longer to make up for higher temperatures in the cold aisle and to enhance thermal management of the internal environment of the MITC (e.g., 220, FIG. 2.1).

In one or more embodiments, in addition to being mechanical hard-stop components, the set of RMCs (e.g., 430A) may act as air containment components, in which the set of RMCs (e.g., 430A) may segregate cold air in a cold aisle from hot air in a hot aisle (or from other air in the MITC (e.g., 210, FIG. 2.1)). In this manner, the set of RMCs (e.g., 430A) may (i) increase cooling efficiency of the MECC (e.g., 210, FIG. 2.1), (ii) reduce the amount of time of the MECC (e.g., 210, FIG. 2.1) needs to operate, (iii) reduce recirculation (e.g., mixing of hot air with cold air), (iv) bypass airflow from one aisle to another aisle, (v) improve usability and serviceability of the computing devices (e.g., 270, FIG. 2.2), (vi) enhance thermal management of the internal environment of the MITC (e.g., 220, FIG. 2.1), (vii) prevent damage to the hardware components of the computing devices (e.g., 270, FIG. 2.2), and (viii) improve functionality of the hardware components of the computing devices (e.g., 270, FIG. 2.2).

In one or more embodiments, to further support the air containment within the MITC (e.g., 220, FIG. 2.1) and to provide a better cold air distribution, for example, (i) additional RMCs may be affixed to a bottom side of the IHSs (e.g., 401A, 401B, etc.) and (ii) the IHSs (e.g., 401A, 401B, etc.) may be affixed to a "raised floor", which is affixed to the bottom side of the MITC (e.g., 220, FIG. 2.1).

The aforementioned example is not intended to limit the scope of the invention.

A "raised floor" is a data center construction model where a slightly higher floor is constructed above a floor (e.g., a bottom side) of the data center. A raised floor generates an open space between the two floors for a better (i) cold air distribution (via, for example, bottom ducting components), (ii) air containment, and (iii) cable management within the data center.

In one or more embodiments, in order to secure, for example, the IHS (401A) to the MORC (402), the RMC (430A) may be a bracket (e.g., an L bracket) that includes two portions. For example, a first portion of the RMC (430A) refers to a portion of the RMC (430A) that is secured to the MHs (e.g., 265B, 265D, FIG. 2.2) to affix the RMC (430A) to the top side of the IHS (401A). A second portion of the RMC (430A) refers to a portion of the RMC (430A) that is secured to a set of MHs (not shown) located on the front side of the MORC (402) to affix the RMC (430A) to the front side of the MORC (402).

In one or more embodiments, the first portion of the RMC (430A) includes a first set of holes (not shown) that allows the bolts (e.g., 435A) to pass through and interface with the MHs (e.g., 265B, 265D, FIG. 2.2). When the first set of holes is aligned with the MHs (e.g., 265B, 265D, FIG. 2.2), the bolts (e.g., 435A) are used to secure the RMC (430A) to the top side of the IHS (401A).

Further, the second portion of the RMC (430A) includes a second set of holes (not shown) to be aligned with the set of MHs. The second set of holes allows a set of bolts (not shown) to pass through and interface with the set of MTh. When the second set of holes is aligned with the set of MHs, the set of bolts is used to secure the RMC (430A) to the front side of the MORC (402). In this manner, the IHS (401A) is secured to the MORC (402).

Those skilled in the art will appreciate that while the bolts (e.g., 435A) are used to secure the RMC (430A) to the top side of the IHS (401A) and to the front side of the MORC (402), any other mechanical or non-mechanical components may be used to secure the secure the RMC (430A) to the top side of the IHS (401A) and to the front side of the MORC (402) without departing from the scope of the invention.

Those skilled in the art will appreciate that while the RMC (430A) is shown as a bracket, the RMC (430A) may be in another shape (while still providing the same functionalities) without departing from the scope of the invention.

Those skilled in the art will appreciate that while the RMC (430A) is shown as a single (e.g., a monolithic) component, the RMC (430A) may be manufactured as having at least two components (while still providing the same functionalities) without departing from the scope of the invention.

In one or more embodiments, because the IHS (401A) includes, for example, a 600 mm wide rack (e.g., a "first type" of rack), the RMC (430A) may be referred to as a "first type" of RMC. In one or more embodiments, if the second type of IHS has a rack width (e.g., 750 mm wide rack) greater than the rack width of the IHS (401A), a "second type" of RMC (not shown) may need to be used (i) to secure the second type of IHS to the second type of MORC and (ii) to further support the air containment within the MITC (e.g., 220, FIG. 2.1).

In one or more embodiments, as an additional airflow management strategy to minimize air leakage, the first type of MORC (402) and the second type of MORC may include air restrictors for cable feeds where they enter into the MORCs (e.g., 402). In one or more embodiments, an air restrictor may be, for example (but not limited to): a brush cable pass-thru component, a brush grommet, etc. Further, to close any gaps that exist between two RMCs (e.g., between the RMC (430A) and a second RMC), another RMC (in any shape or in any size) may be affixed to the RMCs. In this manner, air leakage may also be minimized.

To further improve the cooling efficiency of the MECC (e.g., 210, FIG. 2.1), for example, the second portion of the RMC (430A) may include a gasket (e.g., a continuity gasket) to seal air from leaking past the RMC (430A). In one or more embodiments, the gasket may be, for example (but not limited to): a foam gasket, a rubber gasket, etc.

In addition, the ITC openings (e.g., 428A) may include a shutter (not shown) to support the air containment within the internal environment of the MITC (e.g., 220, FIG. 2.1). For example, when an ITC needs to be placed (e.g., mounted) within the ITC opening (e.g., 428A), the shutter of the ITC opening (e.g., 428A) needs to be opened. The ITC may be then be mounted within the ITC opening (e.g., 428A). As yet another example, if the ITC opening is not in use, the shutter of the ITC opening (e.g., 428A) may be closed. In this manner, the shutter may act as an air containment component to minimize mixing of hot air and cold air.

The aforementioned examples are not intended to limit the scope of the invention.

Those skilled in the art will appreciate that while the details of the RMC (430A), the IHS (401A), and the MORC (402) are discussed above, those details also apply to other RMCs, IHSs, and MORCs disposed within the MITC (e.g., 220, FIG. 2.1) without departing from the scope of the invention.

As discussed above in reference to FIG. 3.1, the first track system (and the second track system) includes one or more TCs (e.g., 421A), in which the bottom side of each TC is affixed to a top side of a corresponding isolator. More specifically, the bottom side of each TC is affixed to IMs (e.g., 423A, 423B, etc.) of a corresponding isolator. For example, the bottom side of the TC (421A) is affixed to IMs (423A, 423B) of the isolator (420A). Details of the TC and the isolator are described above in reference to FIG. 3.1.

In one or more embodiments, the MORC (402) includes a tray that is made of a basket (432) and a set of holders (e.g., 425A).

As being mechanical support components, both the set of holders (e.g., 425A) and the basket (432) are configured to carry cables that are routed from one component to another component for power distribution, control, and communication. Further, the set of holders (e.g., 425A) and the basket (432) are configured to prevent cable congestion at the front sides of the IHSs (401A-401D) for a better cable management. Details of the set of holders, the basket, and the components are described above in reference to FIG. 3.1.

In one or more embodiments, the MORC (402) may have a functionality to be repositioned along the length of the first track system. More specifically, the MORC (402) may shift towards to the front sides or towards to the rear sides of the IHSs (401A-401D) along the length of the first track system. Details of the repositioning process are described above in reference to FIGS. 3.1-3.3.

FIGS. 5.1-5.3 show side views of a portion of the MITC (e.g., 220, FIG. 2.1) in accordance with one or more embodiments of the invention.

Turning now to FIG. 5.1, FIG. 5.1 shows a side view of a portion of the MITC (e.g., 220, FIG. 2.1) in accordance with one or more embodiments of the invention. In an embodiment of the invention shown in FIG. 5.1, the components may be the same as the components of the embodiment shown in FIG. 3.1, except directions of the TCs (510A-510C) are altered.

As discussed above in reference to FIG. 3.1, the track system and the rack (305) are oriented in the first direction, and the MORC (310) is oriented in the second direction, in which the first direction and the second direction are perpendicular to each other. In the embodiment of the invention shown in FIG. 5.1, the track system (e.g., the TCs (510A-510C)) is also oriented in the second direction. Said another way, the orientation of the MORC (502) and the orientation of the track system are now parallel to each other.

Comparing to the repositioning process described above in reference to FIGS. 3.1-3.3, in order to reposition the MORC (502) along the track system, a customer may need to detach the MORC (502) from its current position (e.g., TC (510B)) and, then, attach the MORC (502) to another TC (e.g., 510A) in the track system (shown with arrows). Said another way, without sliding the MORC (502) along the length of the track system, the customer may change the MORC's (502) position by simply attaching the MORC (502) to another TC in the track system. Additional details of the detaching and attaching process are described below in reference to FIGS. 5.2 and 5.3.

Turning now to FIG. 5.2, FIG. 5.2 shows a side view of a portion of the MITC (e.g., 220, FIG. 2.1) in accordance with one or more embodiments of the invention. In an embodiment of the invention shown in FIG. 5.2, the MORC (502) is detached from the TC (510B) and attached to the TC (510A) (shown with an arrow). In this manner, the MORC (502) is moved closer to the front side of the rack (505).

In one or more embodiments, after attaching the MORC (502) to the TC (510A), sizes of the holders (530, 541), the baskets (529, 542), and the first portion of the RMC (532) may be adjusted (either by expanding or by shrinking) in order to provide the same functionalities to the rack (505) and to other components within the MITC (e.g., 220, FIG. 2.1).

For example, once the MORC (502) is attached to the TC (510A), the first holder (530), the first basket (529), and the first portion of the RMC (532) become smaller (comparing to their sizes in FIG. 5.1), whereas the second basket (542) and the second holder (541) become larger (comparing to their sizes in FIG. 5.1). In one or more embodiments, even though the first portion of the RMC (532) becomes smaller, the RMC (532) stays affixed to the MORC (502) and to the rack (505). In this manner, even if the RMC (532) changes its size, the RMC (532) still acts as an air containment component, and still provides structural support to the rack (505) and to the MORC (502).

Similarly, even if the holders (530, 541) and the baskets (529, 542) change their sizes, the holders (530, 541) and the baskets (529, 542) still carry cables from one component to another component, and still act as cable management components. Details of the RMC, the baskets, and the holders are described above in reference to FIG. 3.1.

In one or more embodiments, if the RMC (532) is a monolithic component, once the MORC (502) is attached to the TC (510A), the RMC (532) may be replaced with a second monolithic RMC (which has a smaller first portion) to accommodate the alteration in the position of the MORC (502). In this case, the second monolithic RMC acts as an air containment component, and provides structural support to the rack (505) and to the MORC (502).

Turning now to FIG. 5.3, FIG. 5.3 shows a side view of a portion of the MITC (e.g., 220, FIG. 2.1) in accordance with one or more embodiments of the invention. In an embodiment of the invention shown in FIG. 5.3, the MORC (502) is detached from the TC (510A) and attached to the TC (510C) (shown with an arrow). In this manner, the MORC (502) is moved closer to the rear side of the rack (505).

In one or more embodiments, after attaching the MORC (502) to the TC (510C), sizes of the holders (530, 541), the baskets (529, 542), and the RMC (532) may be further adjusted in order to provide the same functionalities to the rack (505) and to other components within the MITC (e.g., 220, FIG. 2.1).

For example, once the MORC (502) is attached to the TC (510C), the first holder (530), the first basket (529), and the first portion of the RMC (532) become larger (comparing to their sizes in FIG. 5.2), whereas the second basket (542) and the second holder (541) become smaller (comparing to their sizes in FIG. 5.2). In one or more embodiments, even though the first portion of the RMC (532) becomes larger, the RMC (532) stays affixed to the MORC (502) and to the rack (505). In this manner, even if the RMC (532) changes its size, the RMC (532) still acts as an air containment component, and still provides structural support to the rack (505) and to the MORC (502).

Similarly, even if the holders (530, 541) and the baskets (529, 542) change their sizes, the holders (530, 541) and the baskets (529, 542) still carry cables from one component to another component, and still act as cable management components.

In one or more embodiments, if the RMC (532) is a monolithic component, once the MORC (502) is attached to the TC (510C), the RMC (532) may be replaced with a third monolithic RMC (which has a larger first portion) to accommodate the alteration in the position of the MORC (502). In this case, the third monolithic RMC acts as an air containment component, and provides structural support to the rack (505) and to the MORC (502).

In one or more embodiments, based on the above-described track systems, a customer may have a flexibility to re-align a MORC (and its components) along the track system to accommodate various alterations occurred in the white space without redesigning the MORC and without worrying about the effect of alterations.

The problems discussed throughout this application should be understood as being examples of problems solved by embodiments described herein, and the various embodiments should not be limited to solving the same/similar problems. The disclosed embodiments are broadly applicable to address a range of problems beyond those discussed herein.

While embodiments discussed herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A modular information technology component (MITC), comprising:
    a plurality of information handling systems (IHSs);
    a utility control component (UCC),
        wherein the UCC manages a temperature within an IHS of the plurality of IHSs and is configured to detect and suppress fire within the IHS,
        wherein the UCC is integrated within the MITC as a non-standalone component to support the plurality of IHSs;

a modular over-rack component (MORC);

a rack mounting component (RMC); and a track system, wherein the RMC affixes the IHS to the MORC, wherein the MORC is affixed perpendicularly to the track system, wherein the track system permits the MORC to be repositioned along the track system.

2. The MITC of claim 1, wherein the RMC provides air containment within an internal environment of the MITC.

3. The MITC of claim 1, further comprising:

an information technology component (ITC), wherein the MORC comprises a set of ITC openings, and wherein the set of ITC openings enables mounting of the ITC into the MORC.

4. The MITC of claim 3, further comprising:

a tray, wherein the tray is affixed to the MORC, wherein the tray carries cables of the ITC, and wherein the cables transmit or receive power and data from a second ITC.

5. The MITC of claim 1, wherein the MORC comprises a set of isolators, wherein the set of isolators is affixed to the track system, and wherein the track system is affixed to a ceiling of the MITC.

6. The MITC of claim 5, wherein the set of isolators provides a shock isolation to the MORC.

7. The MITC of claim 1, wherein the IHS comprises a rack and a plurality of computing devices, wherein the rack is a housing for the plurality of computing devices.

\* \* \* \* \*